United States Patent
Choi et al.

(10) Patent No.: US 7,301,599 B2
(45) Date of Patent: Nov. 27, 2007

(54) TWO STEP MASKLESS EXPOSURE OF GATE AND DATA PADS

(75) Inventors: Nack-Bong Choi, Kyonggi-do (KR); Seung Hee Nam, Kyonggi-do (KR); Jae-Young Oh, Kyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 2 days.

(21) Appl. No.: 10/653,914

(22) Filed: Sep. 4, 2003

(65) Prior Publication Data
US 2004/0125327 A1 Jul. 1, 2004

(30) Foreign Application Priority Data
Dec. 31, 2002 (KR) ............... 10-2002-0088491
May 1, 2003 (KR) ............... 10-2003-0027982

(51) Int. Cl.
*G02F 1/1345* (2006.01)
(52) U.S. Cl. .................................... 349/152
(58) Field of Classification Search ........... 349/42–43, 349/149, 152
See application file for complete search history.

(56) References Cited

U.S. PATENT DOCUMENTS

| | | | | |
|---|---|---|---|---|
| 4,676,868 A | * | 6/1987 | Riley et al. ............... | 438/697 |
| 5,042,916 A | * | 8/1991 | Ukai et al. ................ | 349/55 |
| 5,477,355 A | * | 12/1995 | Sasaki et al. ............. | 349/42 |
| 5,767,827 A | * | 6/1998 | Kobayashi et al. ....... | 345/87 |
| 5,825,449 A | * | 10/1998 | Shin .......................... | 349/148 |
| 5,909,266 A | * | 6/1999 | Matsuo et al. ............ | 349/187 |
| 5,916,455 A | * | 6/1999 | Kumagai ................... | 216/68 |
| 6,083,766 A | * | 7/2000 | Chen ......................... | 438/15 |
| 6,300,198 B1 | | 10/2001 | Aeugle et al. | |
| 6,710,525 B1 | * | 3/2004 | Lee et al. .................. | 313/309 |
| 2002/0057393 A1 | * | 5/2002 | Park et al. ................. | 349/43 |

(Continued)

FOREIGN PATENT DOCUMENTS

| | | |
|---|---|---|
| CN | 1251207 A | 4/2000 |
| CN | 1385743 A | 12/2002 |
| JP | 2001-257350 | 9/2001 |
| JP | 2002-261078 | 9/2002 |

*Primary Examiner*—David Nelms
*Assistant Examiner*—Phu Vu
(74) *Attorney, Agent, or Firm*—Morgan, Lewis & Bockius LLP

(57) ABSTRACT

A method of fabricating a liquid crystal display device includes forming a gate line, a gate pad, and a gate electrode on a first substrate, forming a gate insulating layer on the gate line, the gate electrode, and the gate pad, forming an active layer on the gate insulating layer, forming an ohmic contact layer on the active layer, forming a data line, a data pad, and source and drain electrodes on the ohmic contact layer, forming a pixel electrode contacting the drain electrode, forming a passivation layer on the substrate including the pixel electrode, forming a common electrode on a second substrate, attaching the first and second substrates such that the pixel electrode and the common electrode are facing into each other, injecting a liquid crystal material between the first and second substrates, and exposing the gate pad and the data pad without forming contact holes.

31 Claims, 37 Drawing Sheets

U.S. PATENT DOCUMENTS

| | | |
|---|---|---|
| 2002/0060380 A1* | 5/2002 | Uner et al. .................. 264/483 |
| 2002/0072139 A1* | 6/2002 | Kashiwabara ................ 438/29 |
| 2002/0105064 A1* | 8/2002 | Lin et al. .................... 257/678 |
| 2002/0167009 A1 | 11/2002 | Kim |
| 2003/0174269 A1* | 9/2003 | Tanaka et al. .............. 349/129 |
| 2005/0012150 A1* | 1/2005 | Byun et al. .................. 257/347 |

* cited by examiner

TWO STEP MASKLESS EXPOSURE OF GATE AND DATA PADS

This application claims the benefit of the Korean Patent Application No. P2002-088491 filed on Dec. 31, 2002, and P2003-027982 filed on May 1, 2003, which are hereby incorporated by reference.

BACKGROUND OF THE INVENTION

1. Field of the Invention

The present invention relates to a liquid crystal display (LCD) device, and more particularly, to a method of fabricating a liquid crystal display device.

2. Discussion of the Related Art

In general, a liquid crystal display (LCD) device includes two substrates, which are spaced apart and facing each other, and a liquid crystal layer interposed between the two substrates. Each of the substrates includes an electrode, and the electrodes of each substrate are also facing each other. A voltage is applied to each electrode, and thus an electric field is induced between the electrodes. An alignment of the liquid crystal molecules is changed by varying an intensity or direction of the electric field. The LCD device displays a picture by varying transmissivity of the light according to the arrangement of the liquid crystal molecules.

The related art LCD device will be described hereinafter more in detail with reference to FIG. 1.

FIG. 1 is an expanded perspective view illustrating the related art liquid crystal display device. The related art LCD device 1 has first and second substrates 5 and 22, which are spaced apart from and facing into each other, and also has liquid crystal 15 interposed between the first substrate 5 and the second substrate 22.

A black matrix 6, a color filter layer 7, and a common electrode 9 are subsequently formed on the inside of the first substrate 5 (i.e., the side facing the second substrate 22). The black matrix 6 has an opening. The color filter layer 7 corresponds to openings in the black matrix 6 and includes three sub-color filters of red (R), green (G), and blue (B). The common electrode 9 is transparent. The first substrate 5 including the black matrix 6, the color filter layer 7, and the common electrode 9 is commonly referred to as a color filter substrate.

A plurality of gate lines 12 and data lines 34 are formed on the inner surface of the second substrate 22 (i.e., the side facing the first substrate 5). The gate lines 12 and the date lines 34 cross each other and define a pixel area P. A thin film transistor T, as a switching element, is formed at the crossing of the gate line 12 and the data line 34. The thin film transistor T includes a gate electrode, a source electrode and a drain electrode. A plurality of the thin film transistors is arranged in a matrix form and connected to the gate and data lines. A pixel electrode 56, which is connected to the thin film transistor T, is formed in the pixel area P. The pixel electrode 56 corresponds to the sub-color filter, and is formed of a transparent conductive material such as indium-tin-oxide (ITO). The second substrate 22, which includes the thin film transistors T and the pixel electrodes 56 arranged in the matrix form, is commonly referred to as an array substrate.

In operating the LCD device, a scanning pulse is applied to the gate electrode of the thin film transistor T through the gate line 12 and a data signal is applied to the source electrode of the thin film transistor T through the data line 34.

The LCD device is driven by the electrical and optical effects of the liquid crystal. The liquid crystal is a dielectric anisotropic material having the characteristic of spontaneous polarization. When a voltage is applied, the liquid crystal forms a dipole by the spontaneous polarization, and thus molecules of the liquid crystal are arranged by an electric field. Optical modulation occurs from the optical characteristics of the liquid crystal, which vary according to the arrangement of the liquid crystal. Images of the LCD device are produced by controlling transmittance of the light due to the optical modulation.

FIG. 2 illustrates a plane view of an array substrate for a LCD device according to the related art. In FIG. 2, a gate line 12 and a data line 34 on a substrate 22 cross each other and define a pixel area P. A thin film transistor T is formed as a switching element at each crossing of the gate and data lines 12 and 34. A gate pad 10 is formed at one end of the gate line 12, and a data pad 36 is formed at one end of the data line 34. A gate pad terminal 58 and a data pad terminal 60, which have an island shape and are formed of a transparent conducting material, overlap the gate pad 10 and the data pad 36, respectively.

The thin film transistor T includes a gate electrode 14 that is connected to the gate line 12 and receives scanning signals, a source electrode 40 that is connected to the data line 34 and receives data signals, and a drain electrode 42 that is spaced apart from the source electrode 40. The thin film transistor T further includes an active layer 32 between the gate electrode 14 and the source and drain electrodes 40 and 42. A metal pattern 38 of an island shape overlaps the gate line 12.

A pixel electrode 56 is formed in the pixel area P and is connected to the drain electrode 42. The pixel electrode 56 is also connected to the metal pattern 38. The gate line 12 and the metal pattern 38 function as first and second storage capacitor electrodes, respectively, and form a storage capacitor Cst with a gate insulating layer (not shown) disposed between the gate line 12 and the metal pattern 38.

Although not shown in the figure, an ohmic contact layer is formed between the active layer 32 and the source and drain electrodes 40 and 42. The active layer 32 is formed of amorphous silicon, and the ohmic contact layer is formed of doped amorphous silicon. A first pattern 35 and a second pattern 39, which include the amorphous silicon and the doped amorphous silicon, are formed under the data line 34 and the metal pattern 38, respectively.

The array substrate of FIG. 2 is fabricated by using four masks.

FIGS. 3A to 3G, FIGS. 4A to 4G, and FIGS. 5A to 5G illustrate the process steps of fabricating an array substrate using four masks, and correspond to cross-sectional views taken along line III-III, line IV-IV, and line V-V of FIG. 2, respectively.

As illustrated in FIGS. 3A, 4A and 5A, a gate line 12, a gate electrode 14, and a gate pad 10 are formed on a transparent insulating substrate 22 by depositing a first metal layer and patterning the first metal layer through a first photolithography process using a first mask. The gate line 12, the gate electrode 14, and the gate pad 10 are formed of a metal material such as aluminum (Al), an aluminum alloy, molybdenum (Mo), tungsten (W), and chromium (Cr). The gate line 12, the gate electrode 14, and the gate pad 10 made of aluminum or an aluminum alloy may be formed of a double layer including molybdenum or chromium.

Next, a gate insulating layer 16, an amorphous silicon layer 18, a doped amorphous silicon layer 20, and a second metal layer 24 are subsequently deposited on the substrate 22 including the gate line 12, the gate electrode 14, and the gate pad 10. The gate insulating layer 16 is formed of an inorganic insulating material, such as silicon nitride (SiNx) and silicon oxide ($SiO_2$), while the second metal material 24 is formed of one of chromium, molybdenum, tungsten and tantalum (Ta).

As illustrated in FIGS. 3B, 4B, and 5B, a photoresist layer 26 is formed on the second metal layer 24 by coating photoresist. A second mask 70, which has a transmitting portion A, a blocking portion B, and a half transmitting portion C, is disposed over the photoresist layer 26 spacing apart from the photoresist layer 26. The half transmitting portion C corresponds to the gate electrode 14. The photoresist layer 26 may be a positive type, and a portion exposed to the light is developed and removed. Subsequently, the photoresist layer 26 is exposed to the light. The photoresist layer 26 corresponding to the half transmitting portion C is exposed less than the photoresist layer 26 corresponding to the transmitting portion A.

As illustrated in FIGS. 3C, 4C, and 5C, the exposed photoresist layer 26 of FIGS. 3B, 4B, and 5B is developed, and a photoresist pattern 26a is formed. Because of different transmittances of the portions of the second mask 70, the photoresist pattern 26a has different thicknesses. A first thickness of the photoresist pattern 26a corresponds to the blocking portion B of FIGS. 3B, 4B, and 5B, and a second thickness of the photoresist pattern 26a, which is thinner than the first thickness, corresponds to the half transmitting portion C of FIGS. 3B, 4B, and 5B.

As illustrated in FIGS. 3D, 4D, and 5D, the second metal layer 24, the doped amorphous silicon layer 20, and the amorphous silicon layer 18 of FIGS. 3C, 4C, and 5C exposed by the photoresist pattern 26a are removed. Thus, a source and drain pattern 28, a data line 34 of FIG. 2, a data pad 36, a doped amorphous silicon pattern 30a, and an active layer 32 are formed. The second metal layer 24 of FIGS. 3C, 4C, and 5C is etched by a wet etching method, and the doped amorphous silicon layer 20, and the amorphous silicon layer 18 of FIGS. 3C, 4C, and 5C are patterned by a dry etching method. The source and drain pattern 28 is formed over the gate electrode 14, and is connected to a data line 34 of FIG. 2, which extends vertically in the context of the drawing. The doped amorphous silicon pattern 30a and the active layer 32 have the same shape as the source and drain pattern 28.

At this time, a metal pattern 38 of an island shape is also formed over the gate line 12. A first pattern 35 and a second pattern 39, which include the amorphous silicon layer and the doped amorphous silicon layer, are formed. The first pattern 35 is located under the data line (not shown), and the data pad 36 and the second pattern 39 is positioned under the metal pattern 38.

Next, as illustrated in FIGS. 3E, 4E, and 5E, the second thickness of the photoresist pattern 26a is removed through an ashing process, so that the source and drain pattern 28 is exposed. Here, the photoresist pattern 26a of the first thickness is also partially removed, and the first thickness of the photoresist pattern 26a is thinned. Additionally, edges of the photoresist pattern 26a are removed, and the metal patterns 28, 36, and 38 are exposed.

As illustrated in FIGS. 3F, 4F, and 5F, the source and drain pattern 28 and the doped amorphous silicon pattern 30a of FIG. 3E, which are exposed by the photoresist pattern 26a of FIG. 3E, are etched. Thus, source and drain electrodes 40 and 42 and an ohmic contact layer 30 are formed, and the active layer 32 is exposed. The exposed active layer 32 between the source and drain electrodes 40 and 42 becomes a channel of a thin film transistor. The source and drain electrodes 40 and 42 are spaced apart from each other. A region between the source and drain electrodes 40 and 42 corresponds to the half transmitting portion C of the second mask 70 of FIG. 3B. If the source and drain pattern 28 of FIG. 3E is formed of molybdenum (Mo), the source and drain pattern 28 and the doped amorphous silicon pattern 30a of FIG. 3E can be removed using a dry etching method at once. However, if the source and drain pattern 28 is formed of chromium (Cr), the source and drain pattern 28 is etched by a wet etching method, and then the doped amorphous silicon pattern 30a is removed by a dry etching method.

As stated above, the source and drain electrodes 40 and 42, the data line, the data pad 36, the metal pattern 38, the ohmic contact layer 30, and the active layer 32 are formed through a second photolithography process using the second mask of FIGS. 3B, 4B, and 5B.

Next, the photoresist pattern 26a is removed, and a passivation layer 46 is formed on the data line, the source and drain electrodes 40 and 42, the data pad 36, and the metal pattern 38 by coating a transparent organic material, such as benzocyclobutene (BCB) and acrylic resin, or depositing an inorganic material, such as silicon nitride (SiNx) and silicon oxide ($SiO_2$). The passivation layer 46 is patterned with the gate insulating layer 16 through a third photolithography process using a third mask, and a drain contact hole 48, a storage contact hole 50, a gate pad contact hole 52, and a data pad contact hole 54 are formed. The drain contact hole 48, the storage contact hole 50, the gate pad contact hole 52, and the data pad contact hole 54 expose the drain electrode 42, the metal pattern 38, the gate pad 10, and the data pad 36, respectively. Here, the storage contact hole 50 exposes a sidewall of the metal pattern 38.

As illustrated in FIGS. 3G, 4G, and 5G, a pixel electrode 56, a gate pad terminal 58, and a data pad terminal 60 are formed on the passivation layer 46 by depositing a transparent conductive material, such as indium-tin-oxide (ITO) and indium-zinc-oxide (IZO), and patterning the transparent conductive material through a fourth photolithography process using a fourth mask. The pixel electrode 56 is connected not only to the drain electrode 42 through the drain contact hole 48, but also to the metal pattern 38 through the storage contact hole 50. The gate pad terminal 58 and the data pad terminal 60 are connected to the gate pad 10 and the data pad 36 through the gate pad contact hole 52 and the data pad contact hole 54, respectively.

As mentioned above, the array substrate is fabricated through the photolithography processes using masks. The photolithography process includes several steps of cleaning, coating a photoresist layer, exposing through a mask, developing the photoresist layer, and etching. Therefore, a fabricating time, costs, and failure can be decreased by reducing the number of the photolithography process.

SUMMARY OF THE INVENTION

Accordingly, the present invention is directed to a method of fabricating a liquid crystal display device that substantially obviates one or more of problems due to limitations and disadvantages of the related art.

Another object of the present invention is to provide a method of fabricating a liquid crystal display device that increases productivity because of shorter processes and a lower cost.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a liquid crystal display device includes forming a gate line, a gate pad, and a gate electrode on a first substrate, forming a gate insulating layer on the gate line, the gate electrode, and the gate pad, forming an active layer on the gate insulating layer, forming an ohmic contact layer on the active layer, forming a data line, a data pad, and source and drain electrodes on the ohmic contact layer, forming a pixel electrode contacting the drain electrode, forming a passivation layer on the substrate including the pixel electrode, forming a common electrode on a second substrate, attaching the first and second substrates such that the pixel electrode and the common electrode are facing into each other, injecting a liquid crystal material between the first and second substrates, and exposing the gate pad and the data pad without forming contact holes.

In another aspect of the present invention, a method of fabricating an array substrate for a liquid crystal display device includes forming a gate line, a gate pad, and a gate electrode on a substrate, forming a gate insulating layer on the gate line, the gate electrode, and the gate pad, forming an active layer on the gate insulating layer, forming an ohmic contact layer on the active layer, forming a data line, a data pad, and source and drain electrodes on the ohmic contact layer, forming a pixel electrode contacting the drain electrode, forming a passivation layer on the substrate including the pixel electrode, and exposing the gate pad and the data pad without forming contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
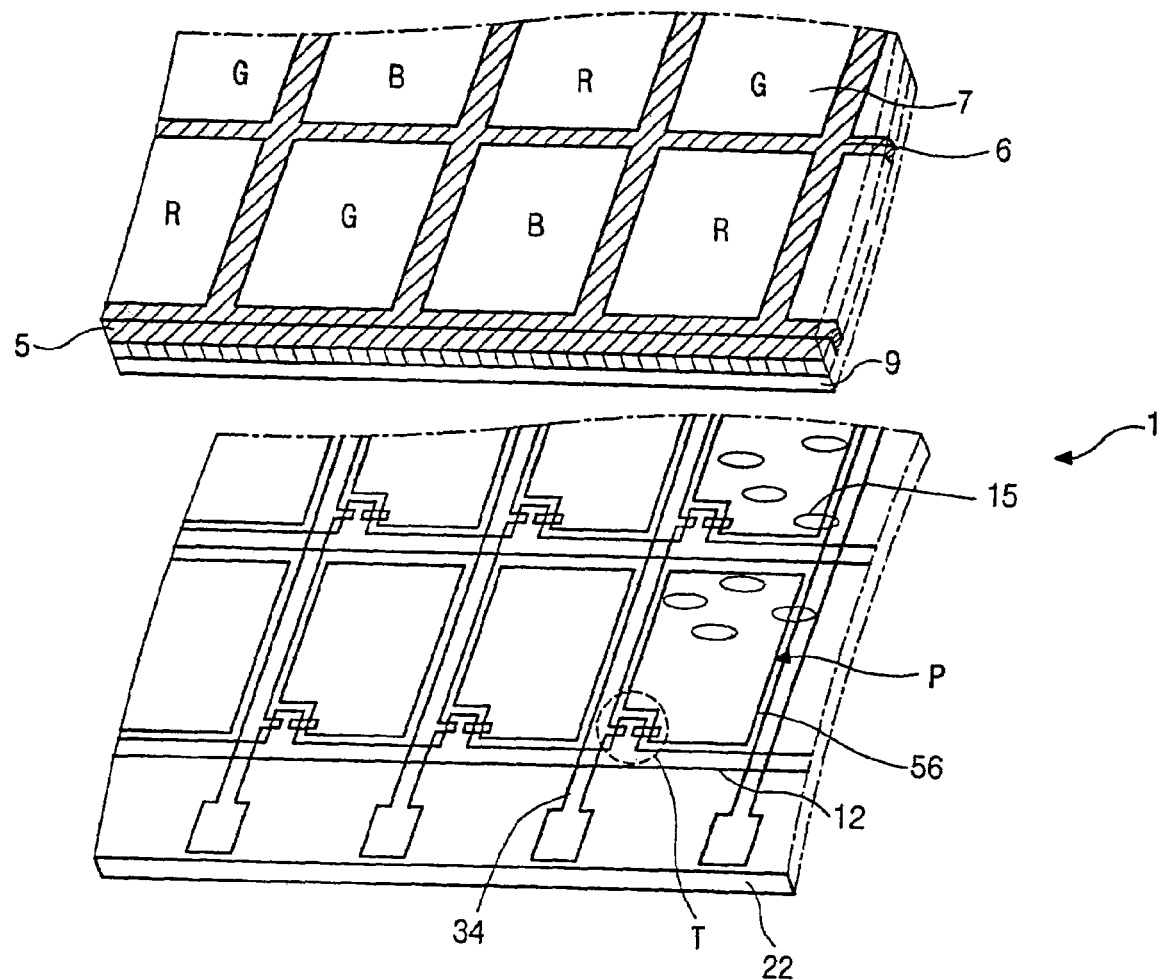
FIG. 1 is an expanded perspective view illustrating the related art liquid crystal display (LCD) device.
Figure 2:
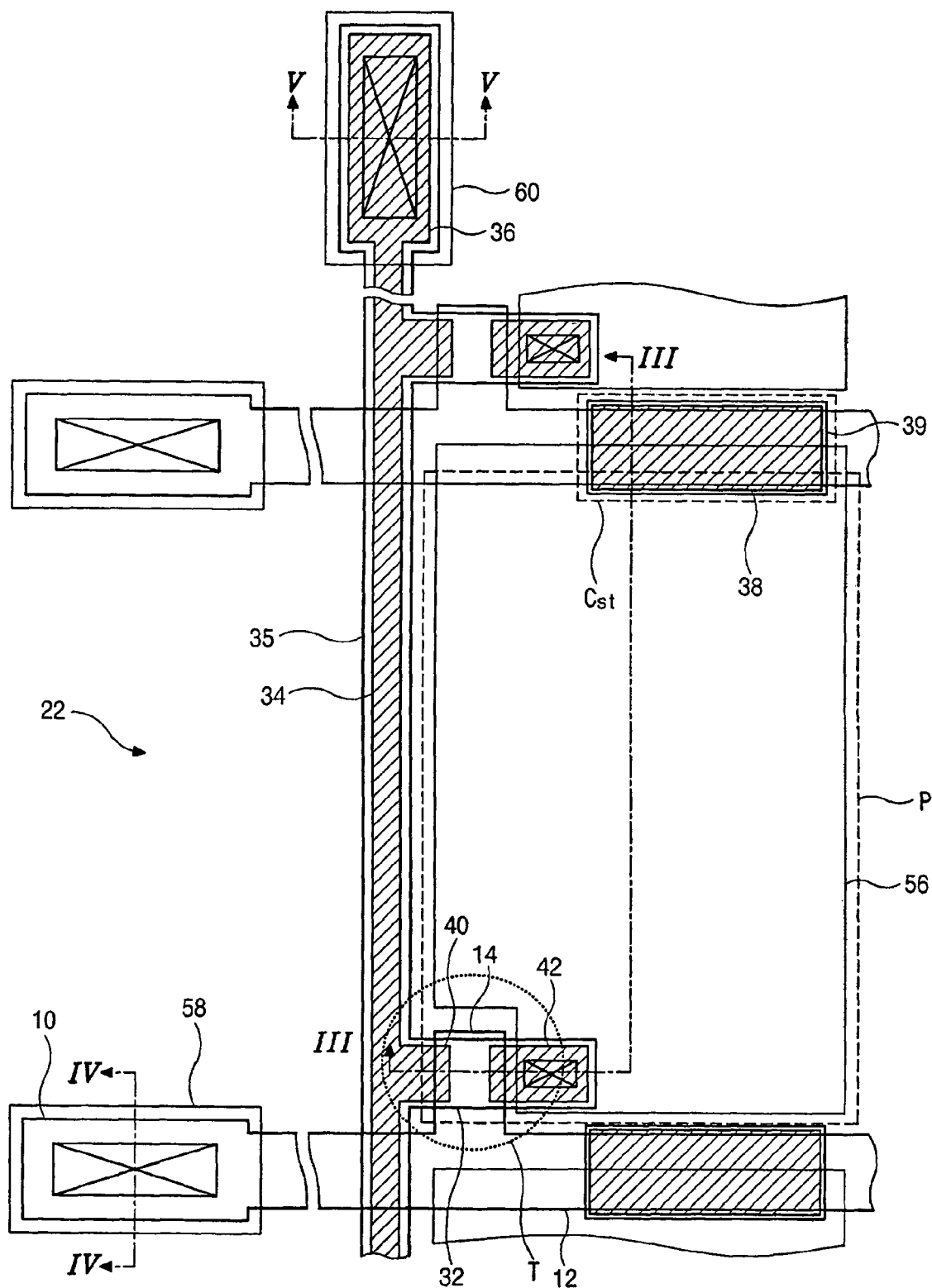
FIG. 2 is a plane view illustrating an array substrate for a LCD device according to the related art.
Figure 3A:
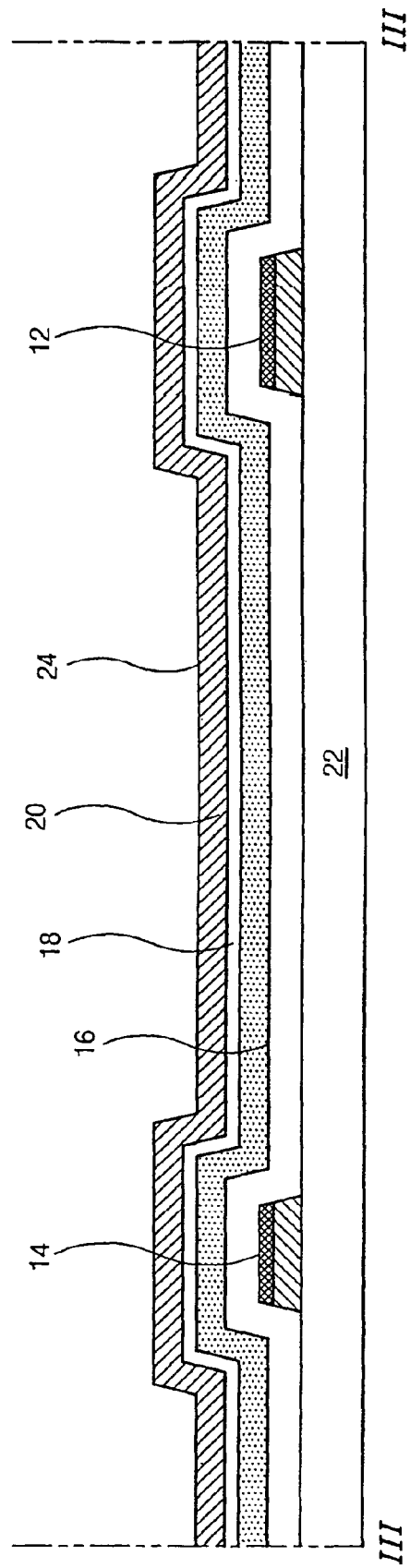
FIGS. 3A to 3G are cross-sectional views illustrating the process steps of fabricating the array substrate according to the related art LCD device taken along line III-III of FIG. 2.
Figure 3B:
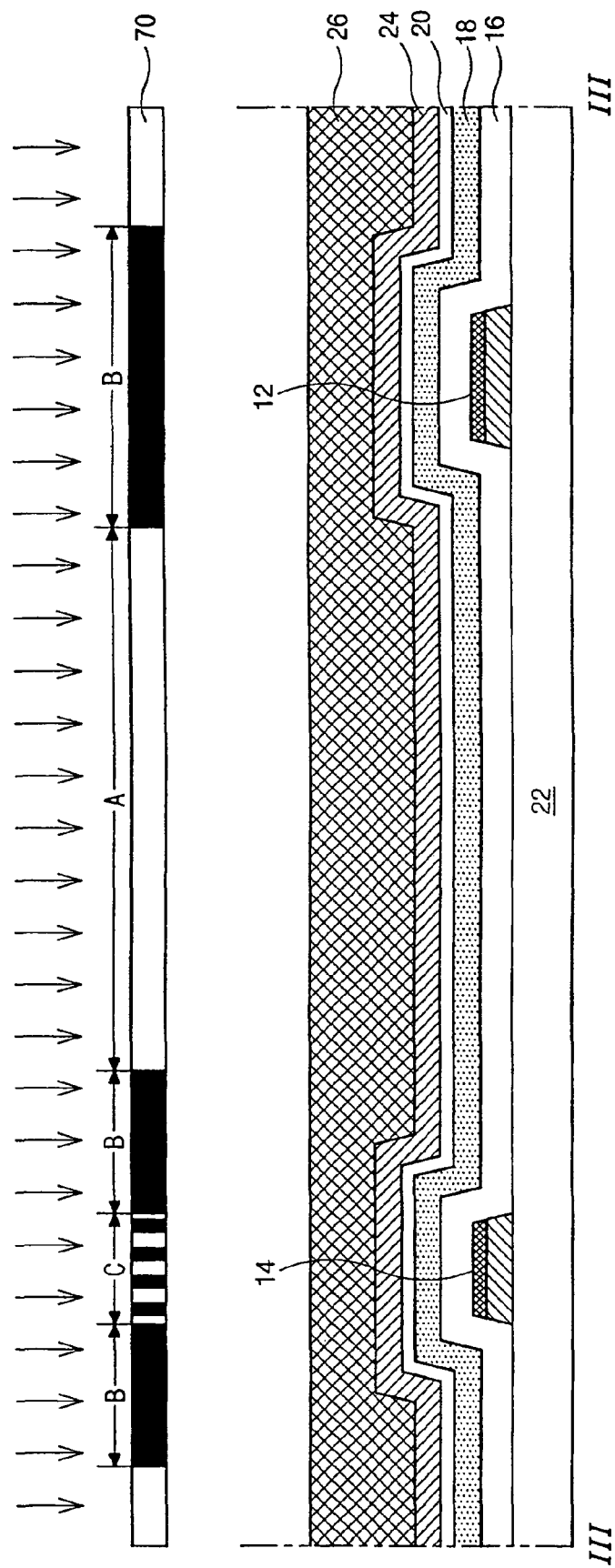
Figure 3C:
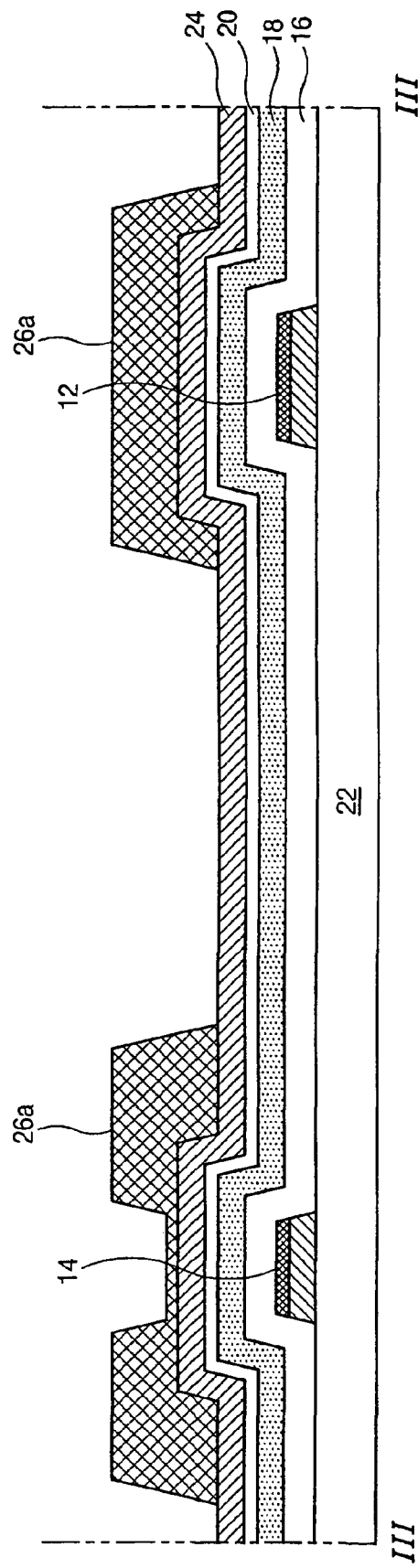
Figure 3D:
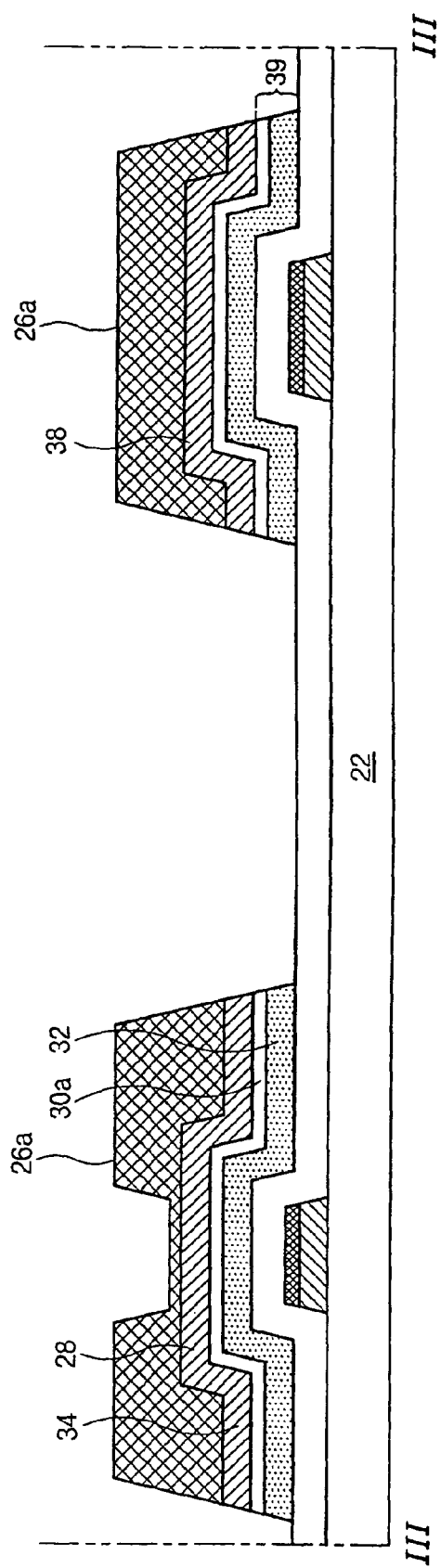
Figure 3E:
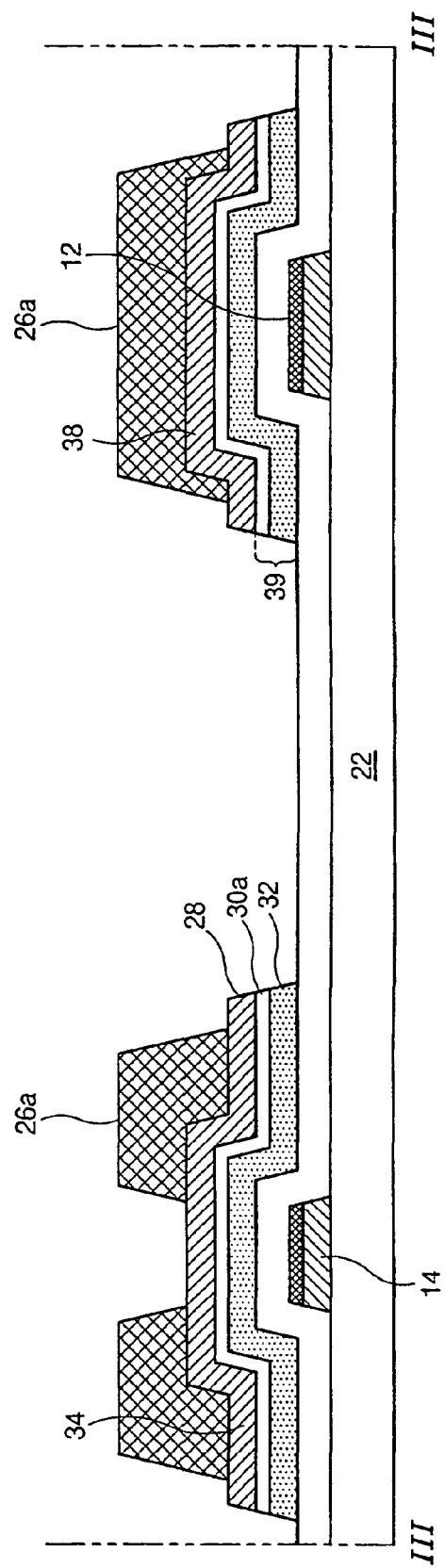
Figure 3F:
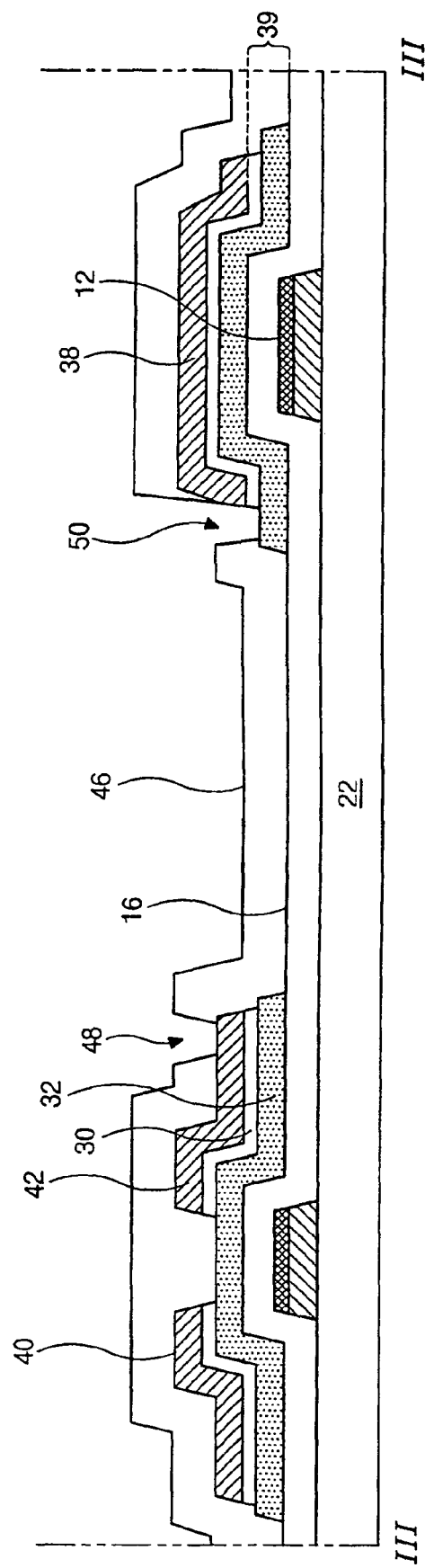
Figure 3G:
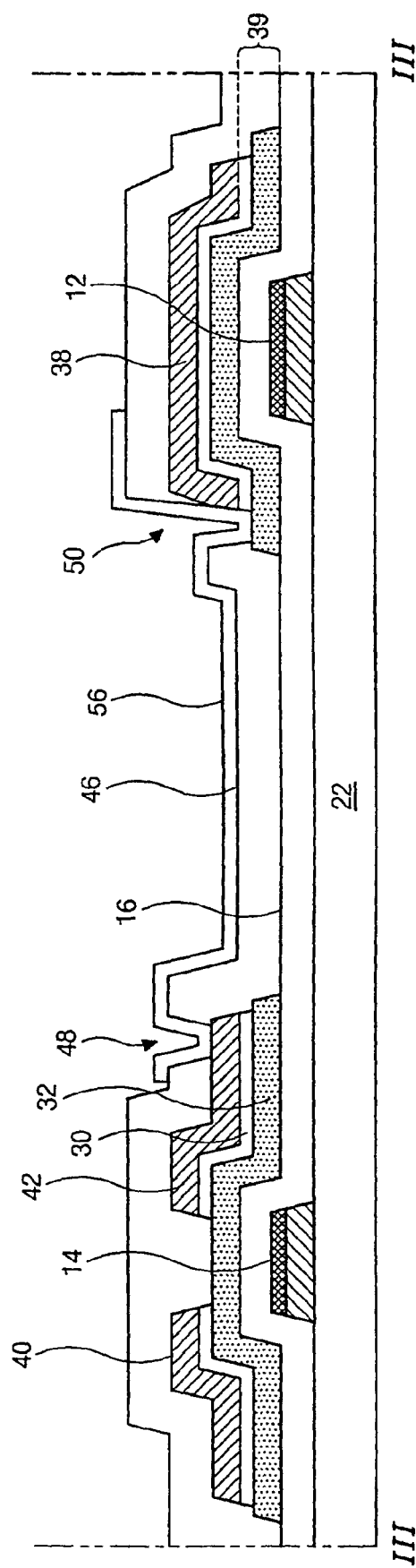
Figure 4A:
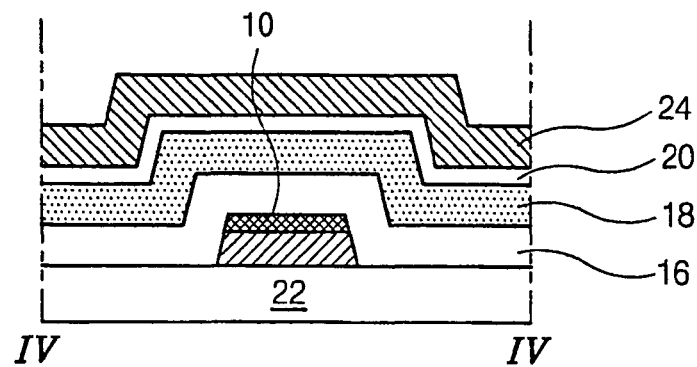
FIGS. 4A to 4G are cross-sectional views illustrating the process steps of fabricating the array substrate according to the related art LCD device taken along line IV-IV of FIG. 2.
Figure 4B:
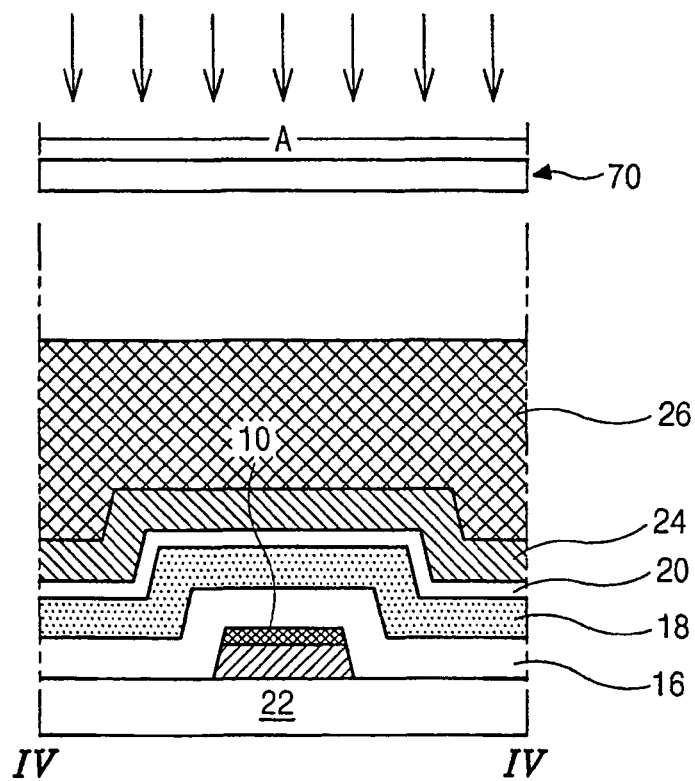
Figure 4C:
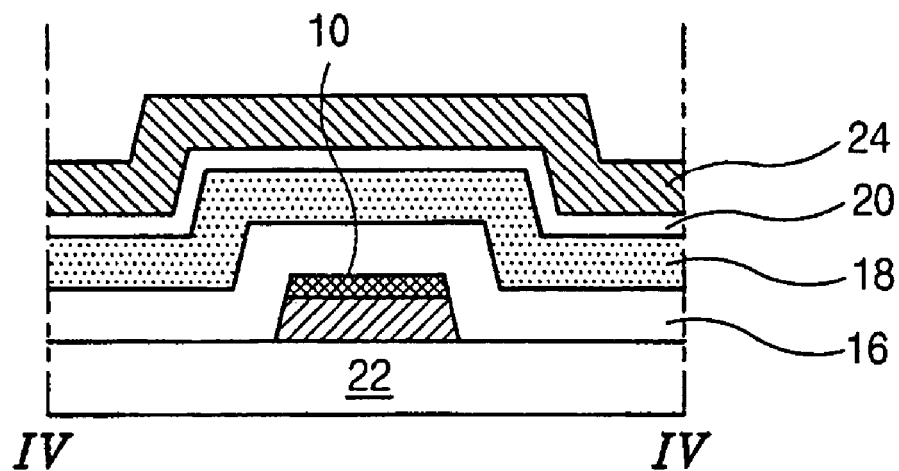
Figure 4D:
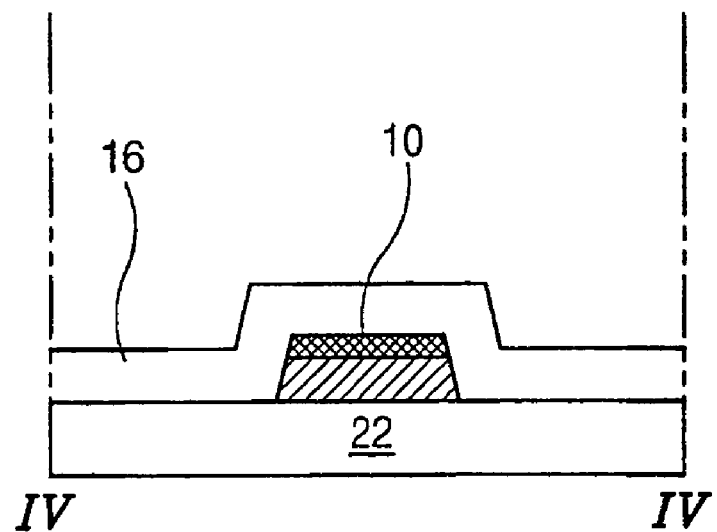
Figure 4E:
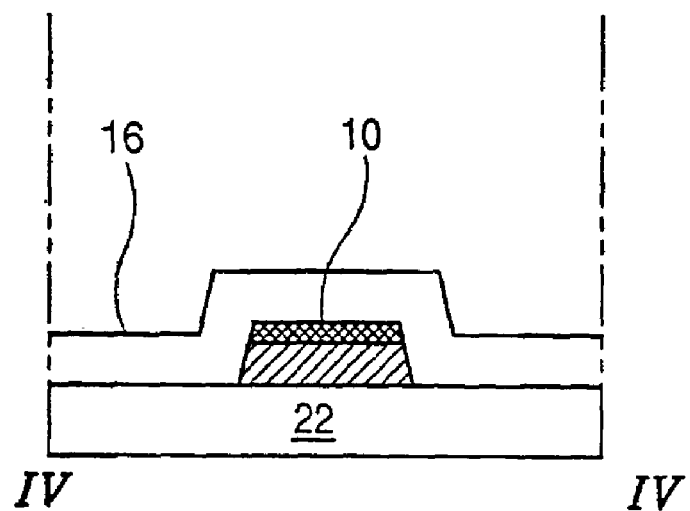
Figure 4F:
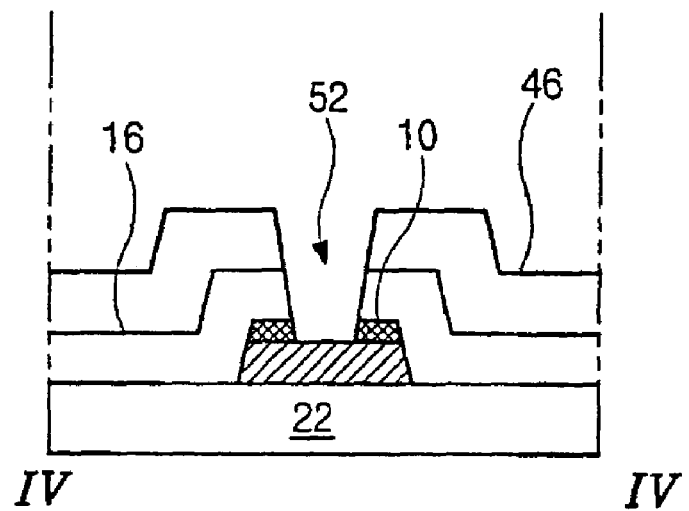
Figure 4G:
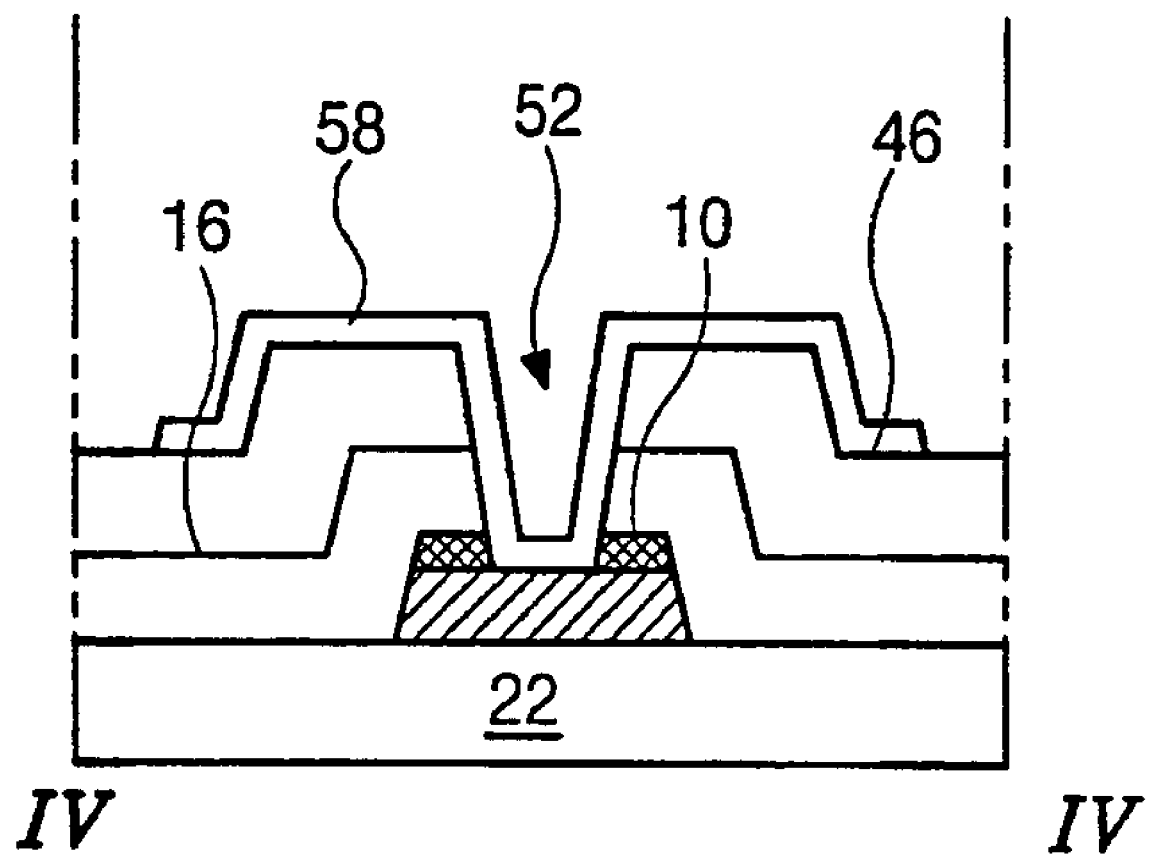
Figure 5A:
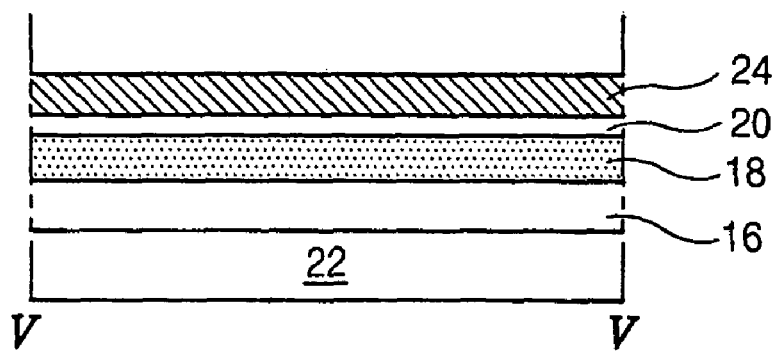
FIGS. 5A to 5G are cross-sectional views illustrating the process steps of fabricating the array substrate according to the related art LCD device taken along line V-V of FIG. 2.
Figure 5B:
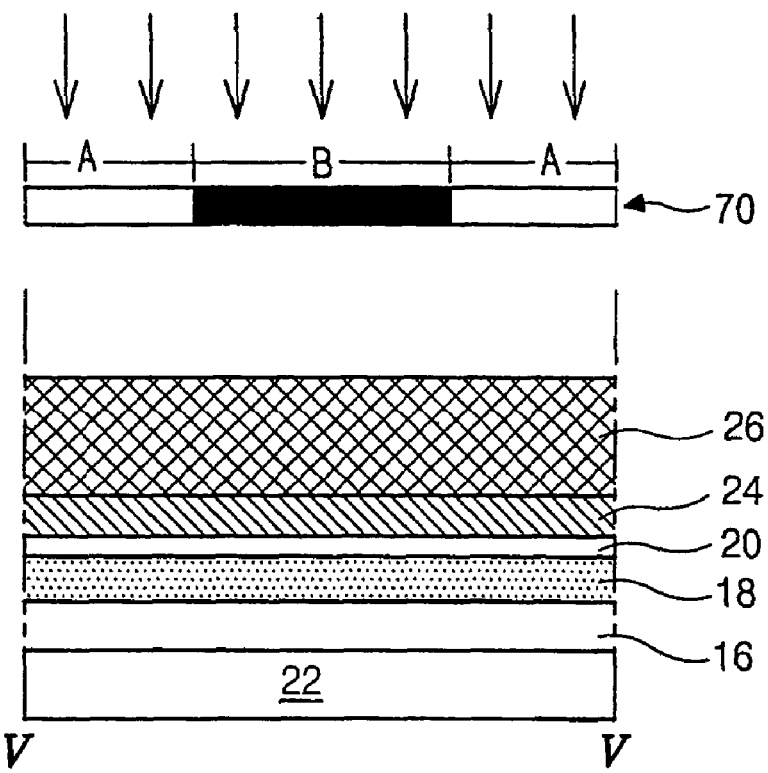
Figure 5C:
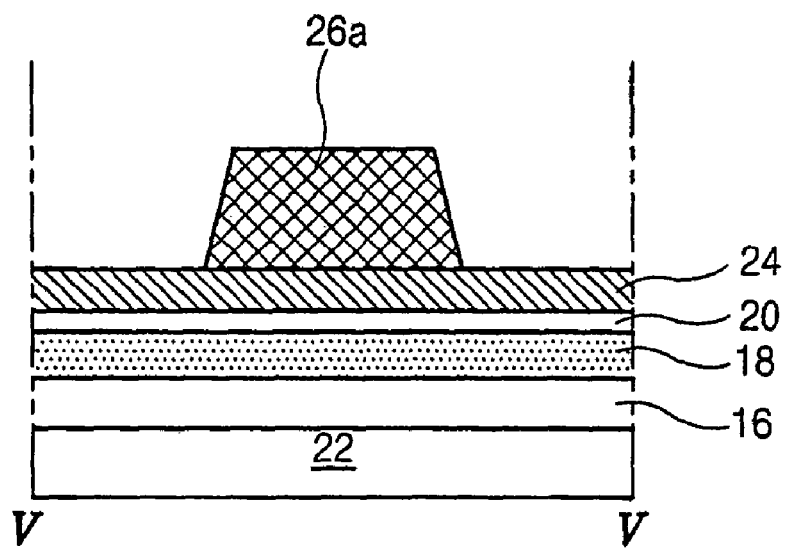
Figure 5D:
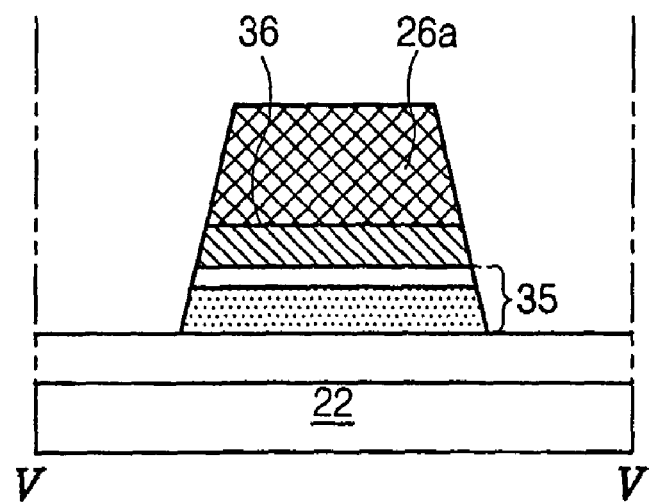
Figure 5E:
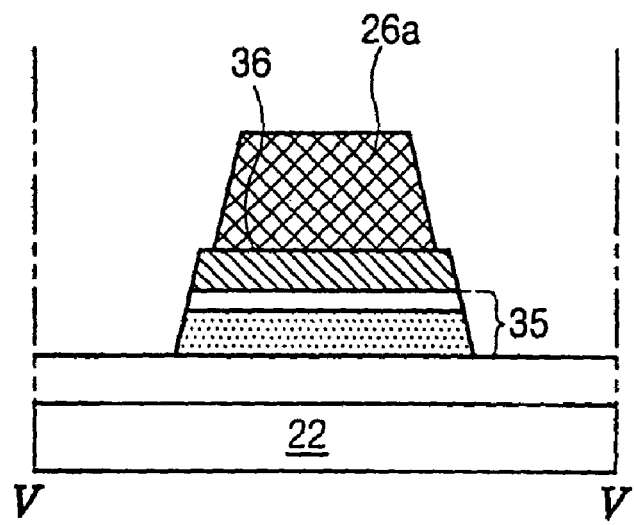
Figure 5F:
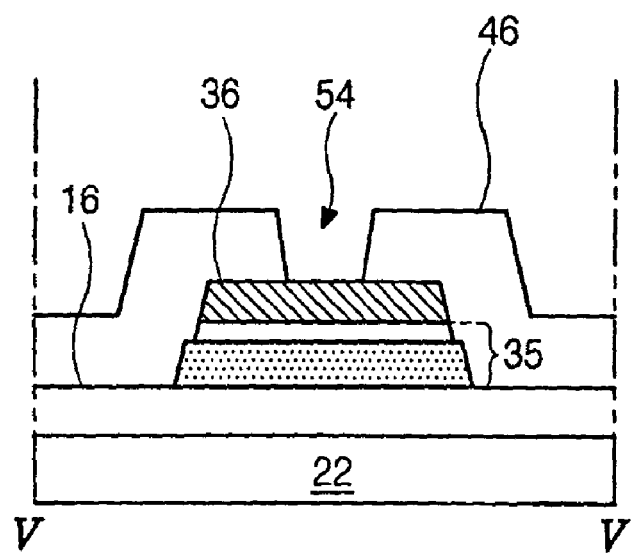
Figure 5G:
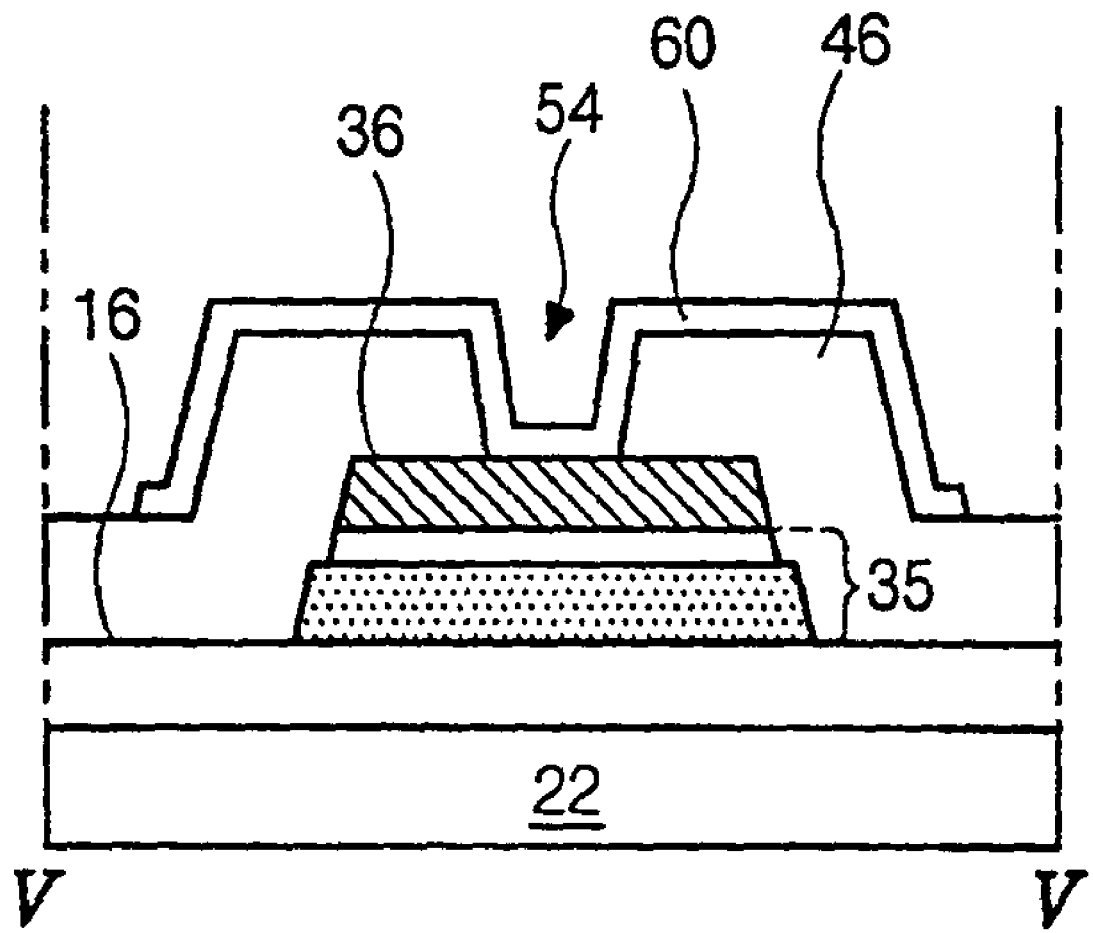
Figure 6:
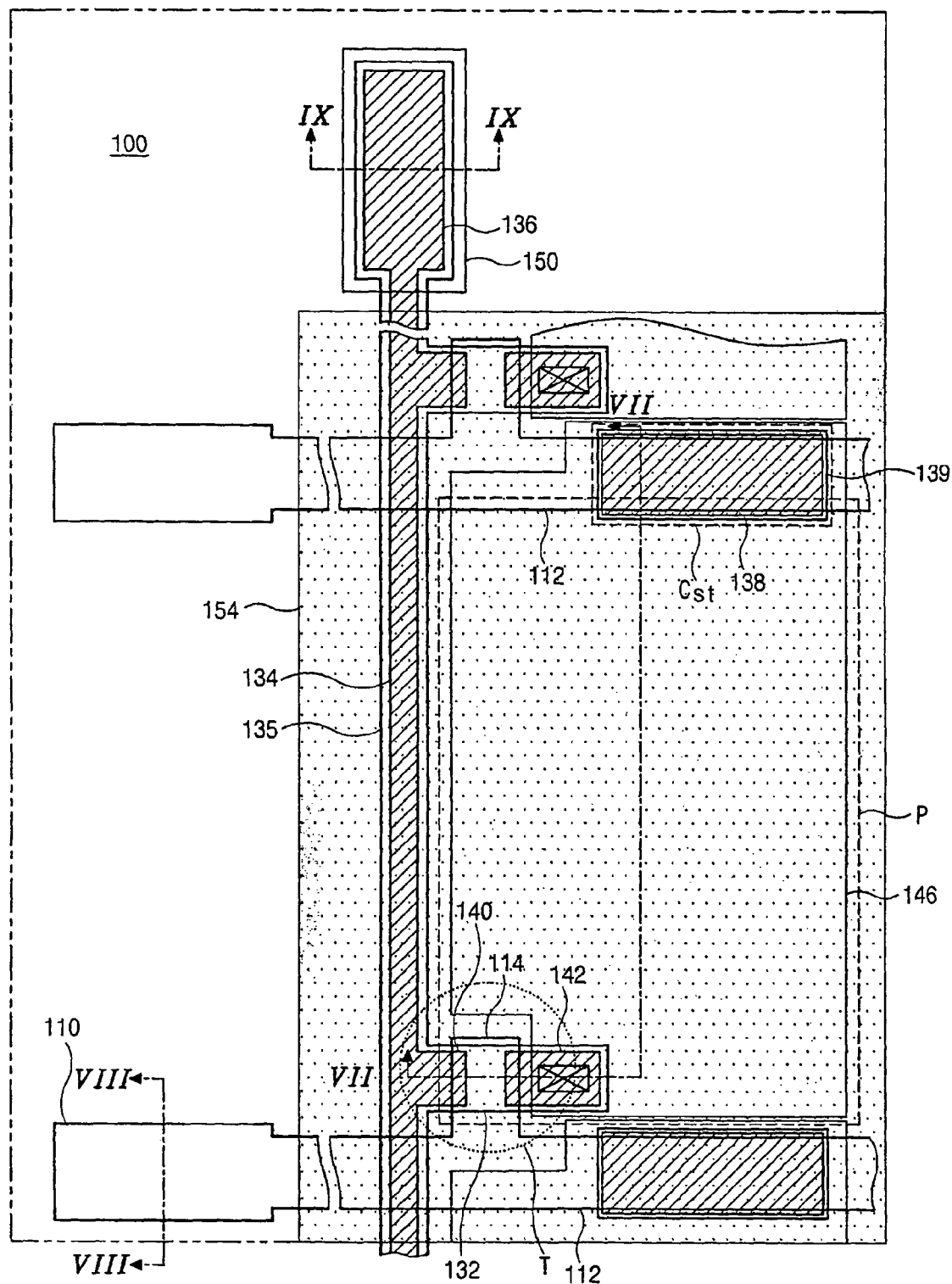
FIG. 6 is a plane view of an array substrate for a liquid crystal display (LCD) device according to the present invention.

FIG. 6 is a plane view of an array substrate for a liquid crystal display (LCD) device according to the present invention.

As illustrated in FIG. 6, a gate line 112 and a data line 134 are formed on a transparent substrate 100. The gate line 112 and the data line 134 cross each other and define a pixel area P. A thin film transistor T is formed as a switching element at each crossing of the gate and data lines 112 and 134. A gate pad 110 is formed at one end of the gate line 112 and a data pad 136 is formed at one end of the data line 134. On the data pad 136, a data pad terminal 150, which have an island shape and are formed of a transparent conducting material, is formed and overlaps the data pad 136.

The thin film transistor T is composed of a gate electrode 114 that is connected to the gate line 112 for receiving scanning signals, a source electrode 140 that is connected to the data line 134 for receiving data signals, and a drain electrode 142 that is spaced apart from the source electrode 140. The thin film transistor T further includes an active layer 132 between the gate electrode 114 and the source and drain electrodes 140 and 142. A metal pattern 138 overlaps the gate line 112. The metal pattern 138 may be formed of the same material as the data line 134.

A pixel electrode 146 is formed in the pixel area P. The pixel electrode 146 is directly connected to the drain electrode 142 and the metal pattern 138 without contact holes. The gate line 112 and the metal pattern 138 function as first and second storage capacitor electrodes, respectively, and form a storage capacitor Cst with a gate insulating layer (not shown) disposed between the gate line 112 and the metal pattern 138.

Although not shown in the figure, an ohmic contact layer is formed between the active layer 132 and the source and drain electrodes 140 and 142. The active layer 132 is formed of amorphous silicon, and the ohmic contact layer is formed of doped amorphous silicon. A first pattern 135 and a second pattern 139, which include the amorphous silicon and the doped amorphous silicon, are formed under the data line 134 and the metal pattern 138, respectively.

FIGS. 7A to 7H, 8A to 8H, and FIGS. 9A to 9H illustrate the process steps of fabricating an array substrate corresponding to the present invention, and are cross-sectional views taken along line VII-VII, line VIII-VIII, and line IX-IX of FIG. 6. respectively.

Figure 7A:
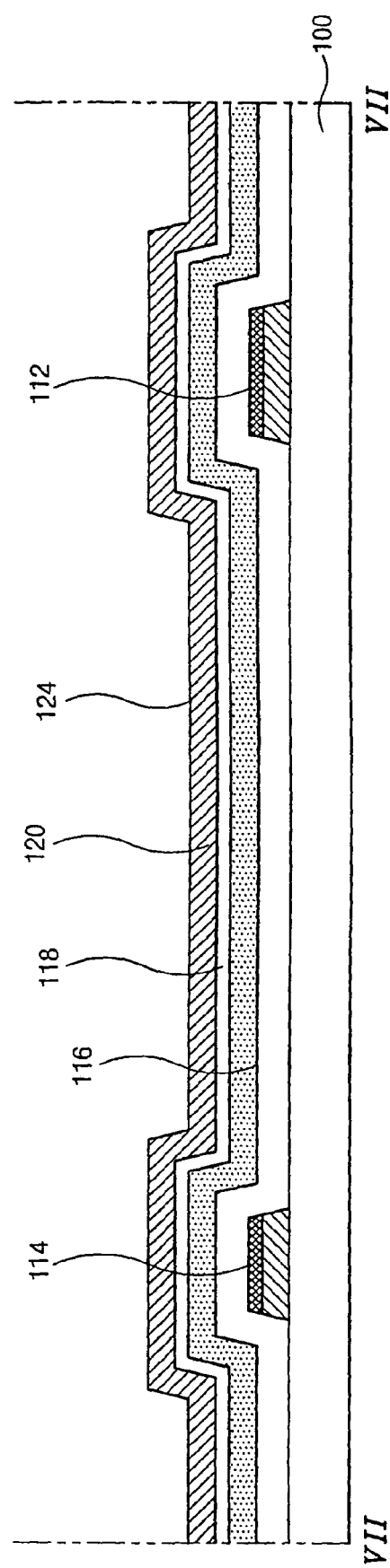
FIGS. 7A to 7H are cross sectional views illustrating the process steps of fabricating the array substrate according to the present invention taken along line VII-VII of FIG. 6.
Figure 8A:
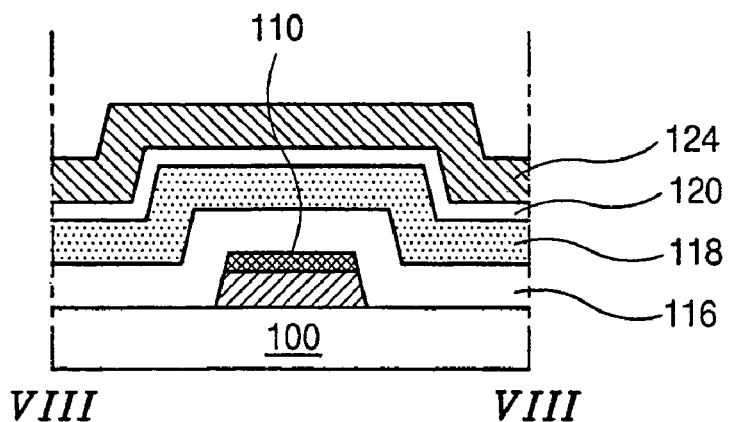
FIGS. 8A to 8H are cross-sectional views taken along line VIII-VIII of FIG. 6.
Figure 9A:
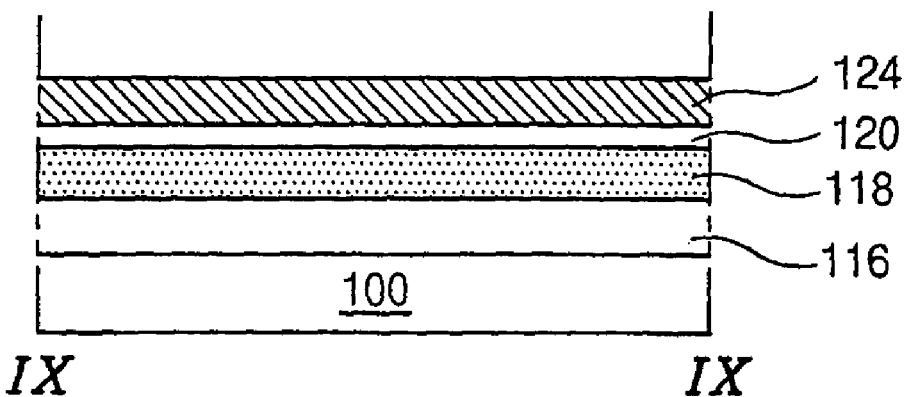
FIGS. 9A to 9H are cross sectional views taken along IX-IX of FIG. 6.

First, as illustrated in FIGS. 7A, 8A, and 9A, a gate line 112, a gate electrode 114, and a gate pad 110 are formed on a transparent substrate 100 by depositing a first metal layer and patterning the first metal layer through a first photolithography process using a first mask. The gate electrode 114 is extended from the gate line 112, and the gate pad 110 is placed at one end of the gate line 112. In order to prevent RC delay, aluminum (Al), which has a relatively low resistivity, is widely used as a gate electrode material. However, pure aluminum is easily corroded by acid and may cause line defects due to hillocks in the following process under high temperatures. Therefore, an aluminum alloy may be used or a double layer including aluminum and other metal material, such as molybdenum may be used.

Next, a gate insulating layer 116, an amorphous silicon layer 118, a doped amorphous silicon layer 120, and a second metal layer 124 are subsequently deposited on the substrate 100 including the gate line 112, the gate electrode 114, and the gate pad 110 thereon. The gate insulating layer 116 is formed of an inorganic insulating material such as silicon nitride (SiNx) and silicon oxide ($SiO_2$). The gate insulating layer 116 may be formed of an organic insulating material such as benzocyclobutene (BCB) and acrylic resin. The second metal layer 124 is formed of one of chromium, molybdenum, tungsten and tantalum (Ta).

Figure 7B:
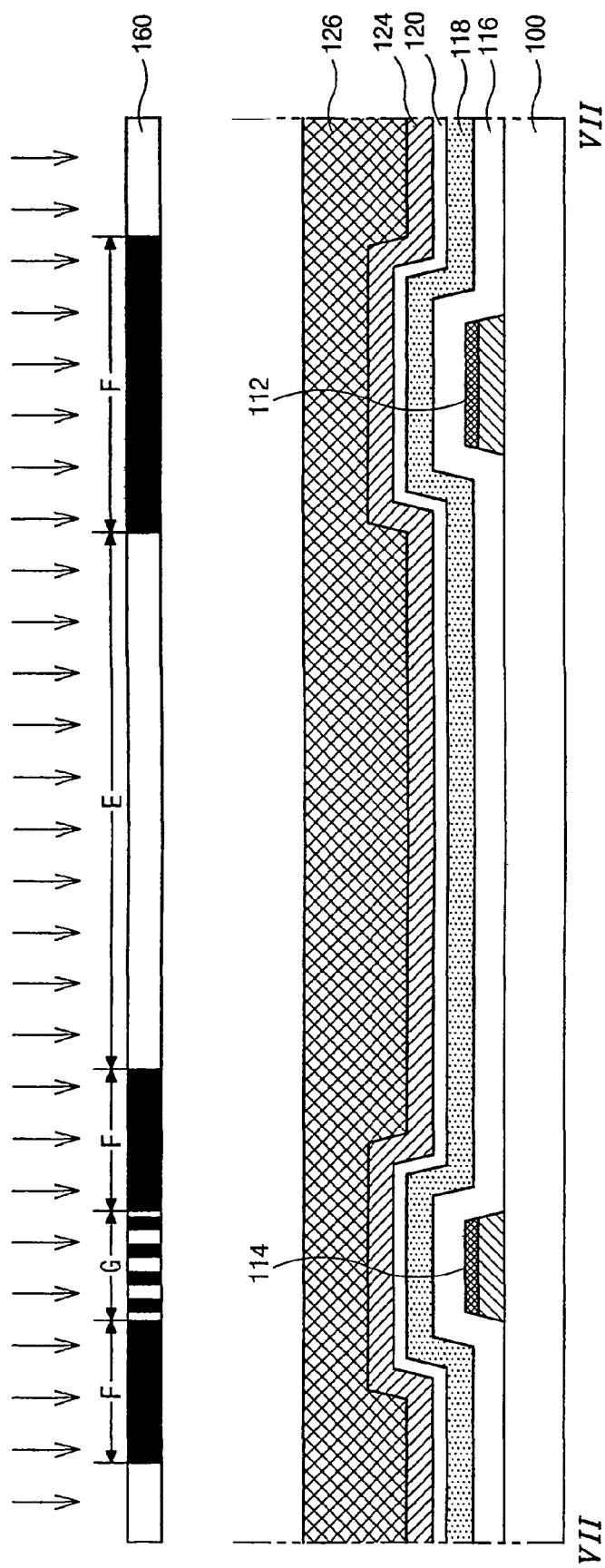
Figure 8B:
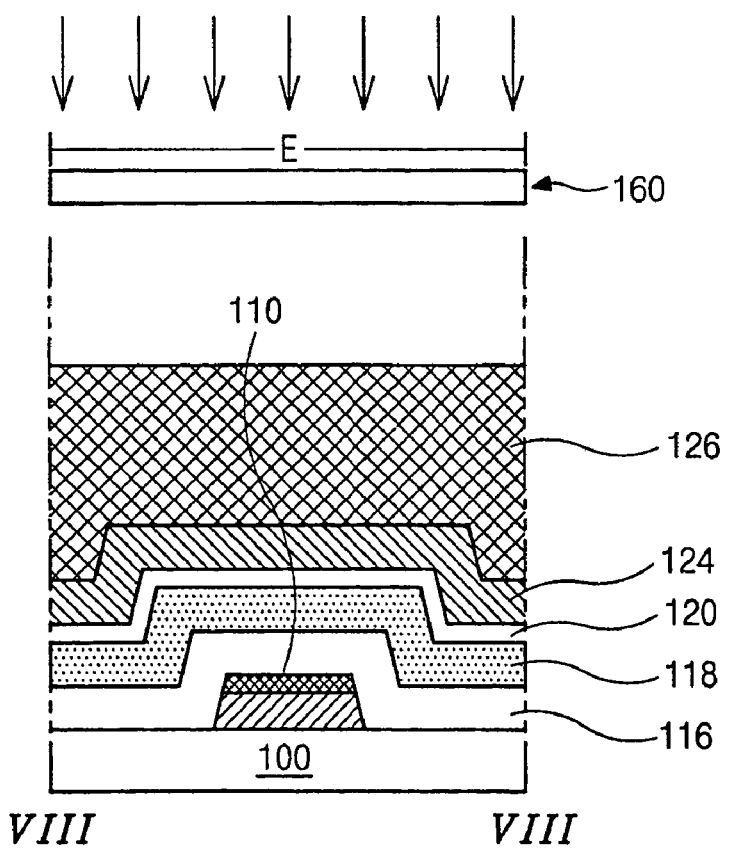
Figure 9B:
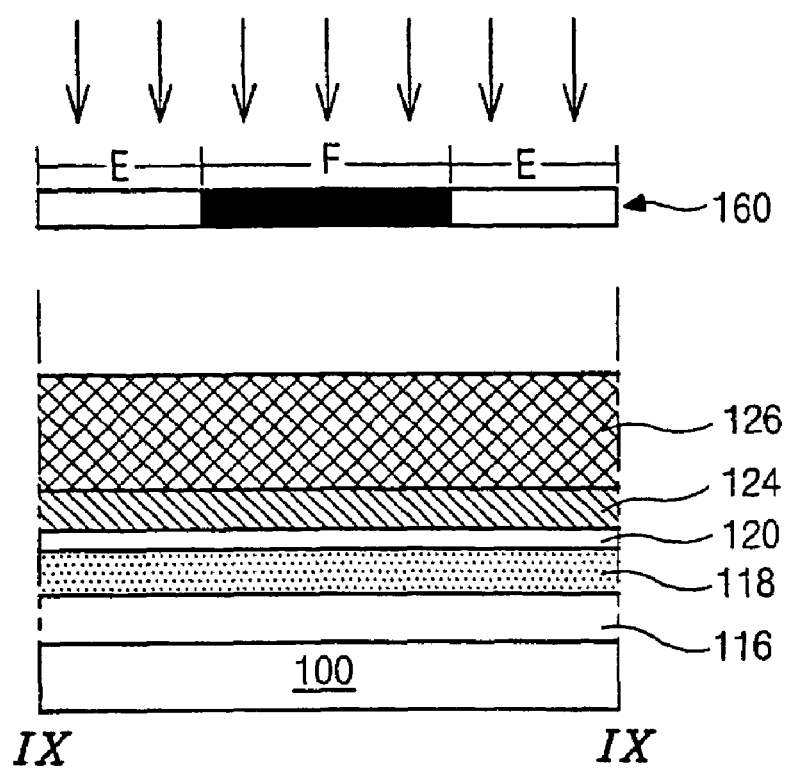

As illustrated in FIGS. 7B, 8B, and 9B, a photoresist layer 126 is formed on the second metal layer 124 by coating photoresist. A second mask 160, which has a transmitting portion E, a blocking portion F, and a half transmitting portion G, is disposed over and spaced apart from the photoresist layer 126. The half transmitting portion G may include slits and corresponds to a channel of a thin film transistor. The photoresist layer 126 may be a positive type, and thus a portion exposed to the light is developed and removed. Subsequently, the photoresist layer 126 is exposed to the light, and the photoresist layer 126 corresponding to the half transmitting portion G is exposed less than the photoresist layer 126 corresponding to the transmitting portion E.

Figure 7C:
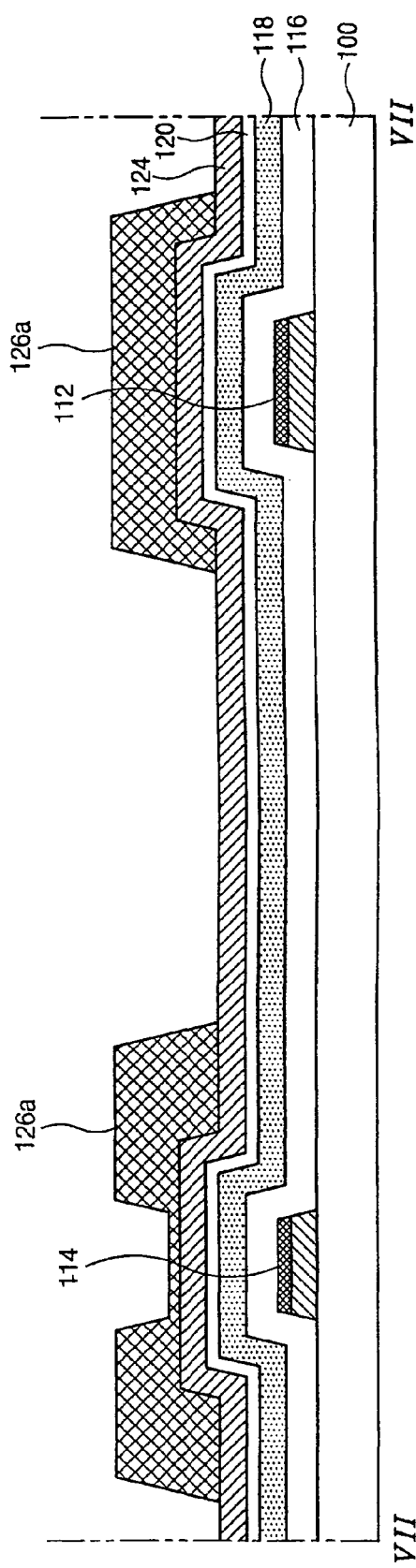
Figure 8C:
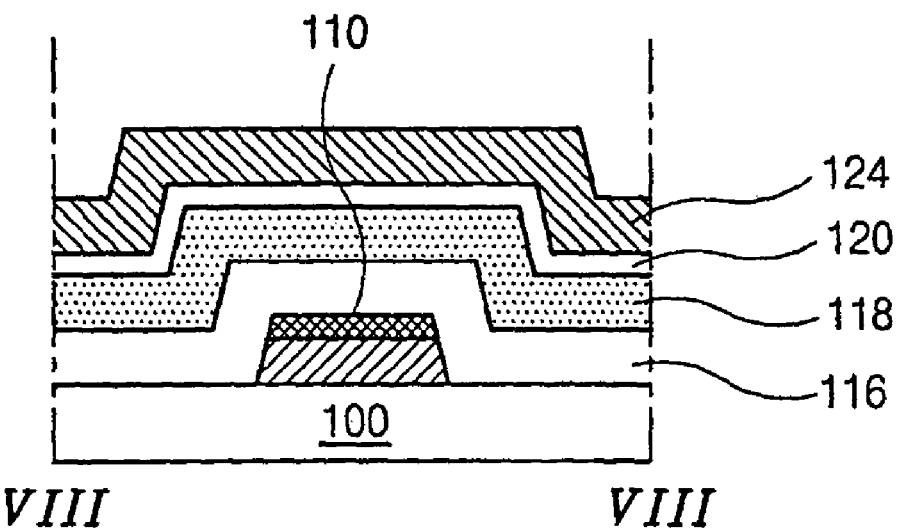
Figure 9C:
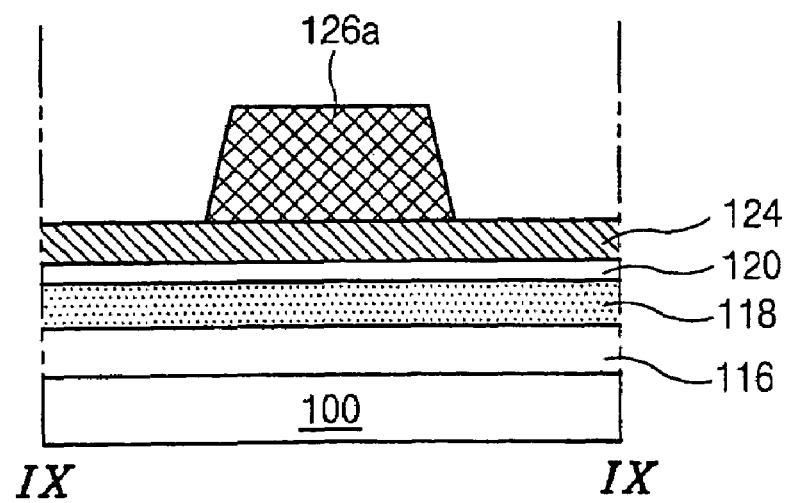

Next, as illustrated in FIGS. 7C, 8C, and 9C, the photoresist layer 126 of FIGS. 7B, 8B, and 9B is developed, and a photoresist pattern 126a having a different thickness is formed. A first thickness of the photoresist pattern 126a corresponds to the blocking portion F of FIGS. 7B, 8B, and 9B, and a second thickness of the photoresist pattern 126a, which is thinner than the first thickness, corresponds to the half transmitting portion G of FIG. 7B.

Figure 7D:
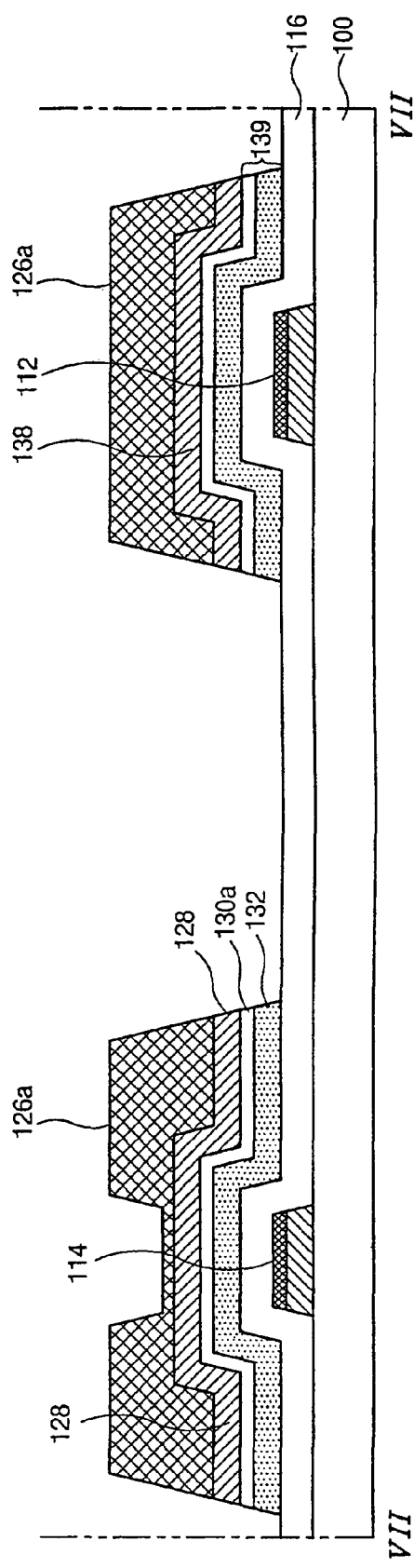
Figure 8D:
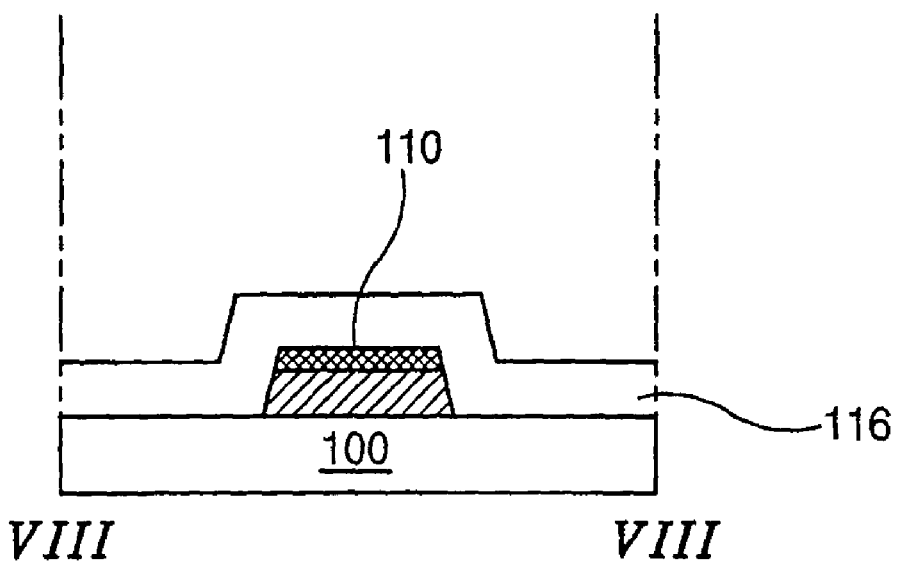
Figure 9D:
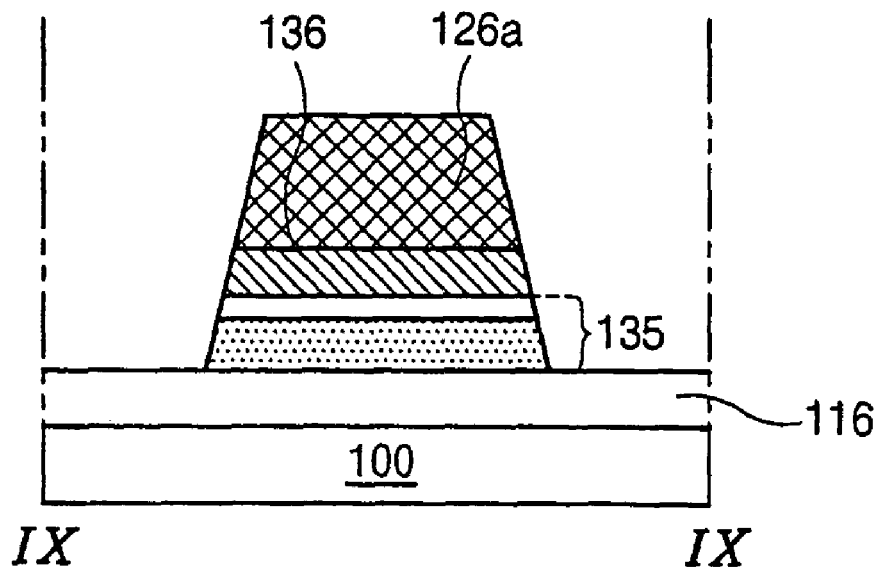

As illustrated in FIGS. 7D, 8D, and 9D, the second metal layer 124, the doped amorphous silicon layer 120 and the amorphous silicon layer 118 of FIGS. 7C, 8C, and 9C exposed by the photoresist pattern 126a are removed. Thus a source and drain pattern 128, a data line 134 of FIG. 6, a data pad 136, a doped amorphous silicon pattern 130a, and an active layer 132 are formed. The second metal layer 124 of FIGS. 7C, 8C, and 9C is etched by a wet etching method, whereas the doped amorphous silicon layer 120 and the amorphous silicon layer 118 FIGS. 7C, 8C, and 9C are patterned by a dry etching method. The source and drain pattern 128 is formed over the gate electrode 114 and is connected to a data line 134 of FIG. 6, which extends vertically in the context of the drawing. The doped amorphous silicon pattern 130a and the active layer 132 have the same shape as the source and drain pattern 128. A metal pattern 138 of an island shape is also formed over the gate line 112. A first pattern 135 and a second pattern 139, which include the amorphous silicon layer and the doped amorphous silicon layer, are formed. The first pattern 135 is located under the data line (not shown) and the data pad 136 and the second pattern 139 is placed under the metal pattern 138.

Figure 7E:
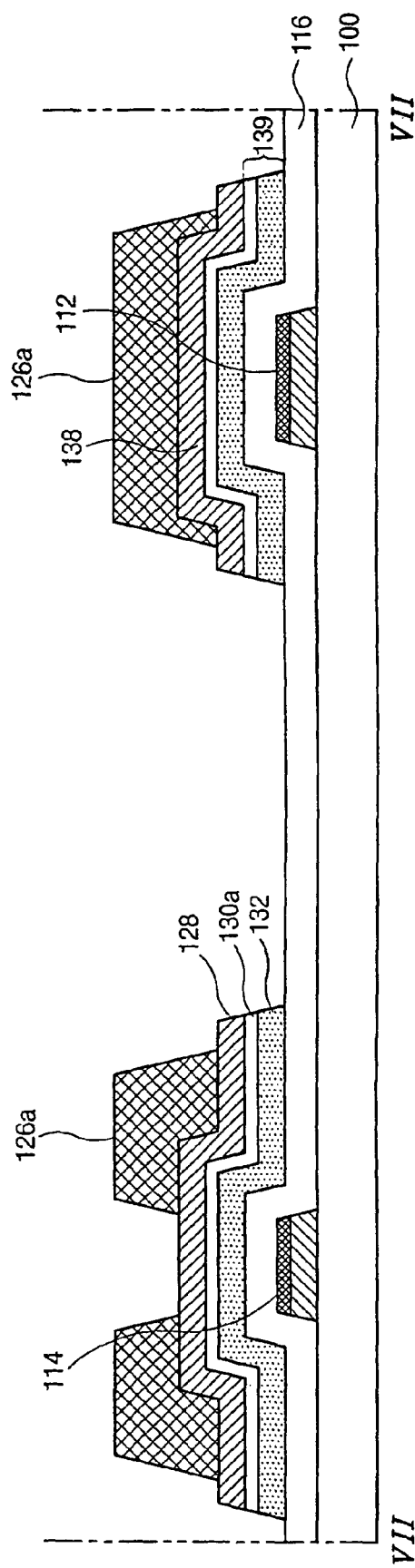
Figure 8E:
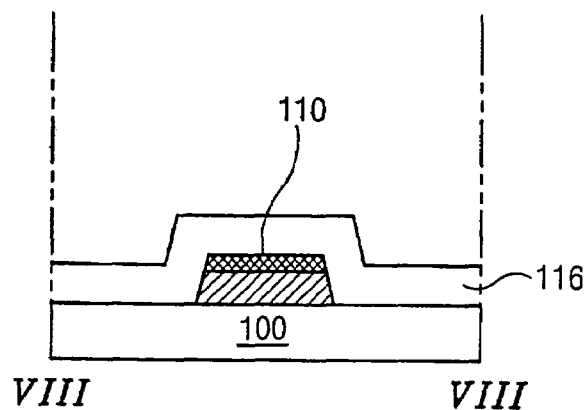
Figure 9E:
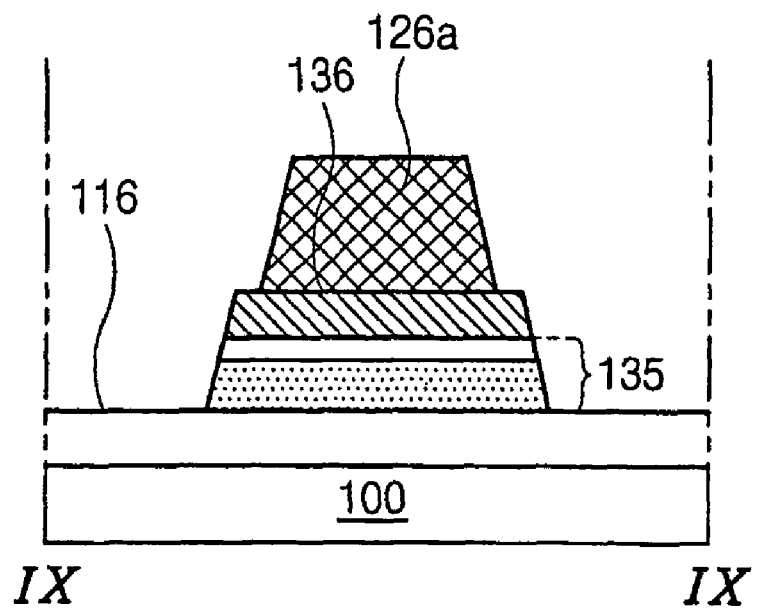

Next, as illustrated in FIGS. 7E, 8E, and 9E, the second thickness of the photoresist pattern 126a is removed through an ashing process, and thus the source and drain pattern 128 is exposed. Here, the first thickness of the photoresist pattern 126a is also partially removed, and the first thickness of the photoresist pattern 126a is thinned. Additionally, edges of the photoresist pattern 126a may be removed, and portions of the metal patterns 128, 136, and 138 may be exposed.

Figure 7F:
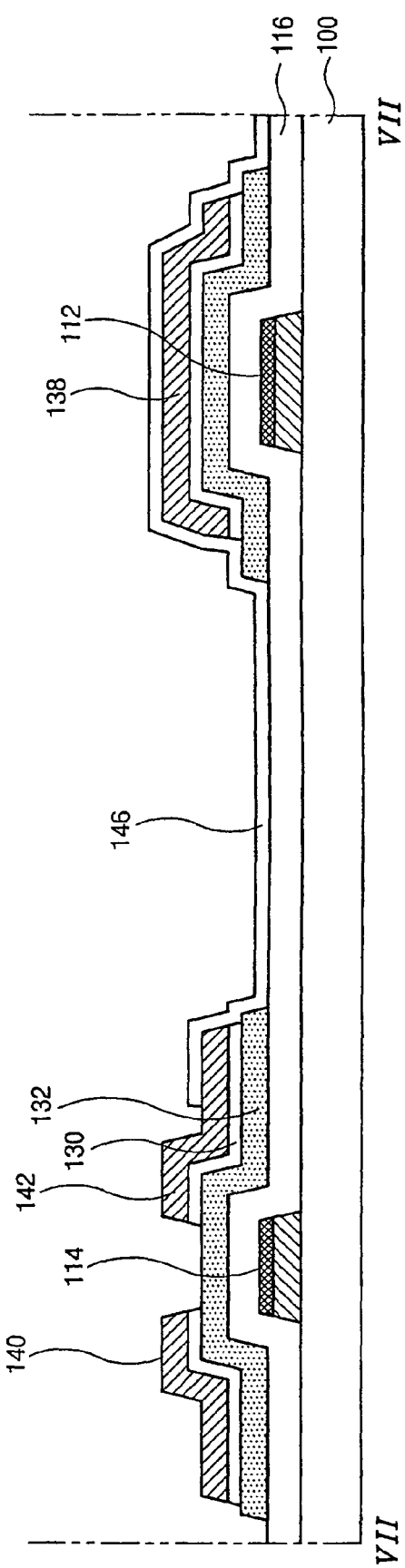
Figure 8F:
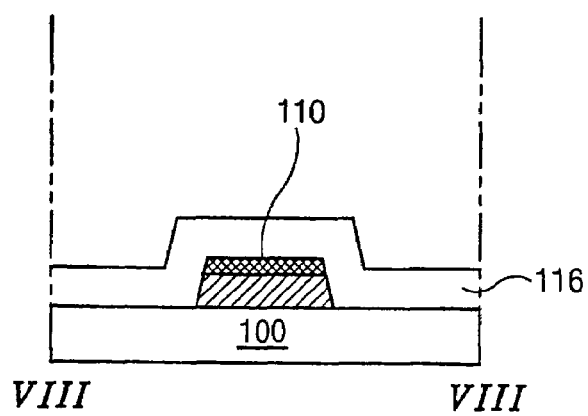
Figure 9F:
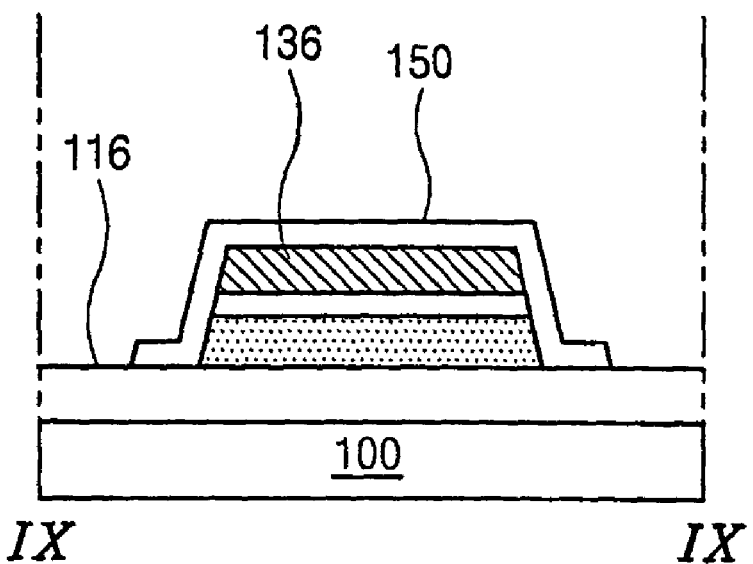

As illustrated in FIGS. 7F, 8F, and 9F, the source and drain pattern 128 and the doped amorphous silicon pattern 130a of FIG. 7E, which are exposed by the photoresist pattern 126a of FIG. 7E, are etched. Thus, source and drain electrodes 140 and 142 and an ohmic contact layer 130 are formed, and the active layer 132 is exposed. The exposed active layer 132 between the source and drain electrode 140 and 142 becomes the channel of the thin film transistor and corresponds to the half transmitting portion G of the second mask 160 of FIG. 7B. The source and drain electrodes 140 and 142 are spaced apart from each other. If the source and drain pattern 128 of FIG. 7E is formed of molybdenum (Mo), the source and drain pattern 128 and the doped amorphous silicon pattern 130a of FIG. 7E can be removed by using a dry etching method at once. However, if the source and drain pattern 128 is formed of chromium (Cr), the source and drain pattern 128 is etched by a wet etching method, and then the doped amorphous silicon pattern 130a is removed by a dry etching method.

As stated above, the source electrode 140 and the drain electrode 142, the data line 134 of FIG. 6, the data pad 136, the metal pattern 138, the ohmic contact layer 130, and the active layer 132 are formed through a second mask process using the second mask 160 of FIGS. 7B, 8B, and 9B.

Next, the photoresist pattern 126a of FIG. 7E is removed, and a pixel electrode 146 and a data pad terminal 150 are formed on the substrate 100 including the source and drain electrodes 140 and 142 by depositing a transparent conductive material, such as indium-tin-oxide (ITO) and indium-zinc-oxide (IZO), and patterning the transparent conductive material through a third photolithography process using a third mask. The pixel electrode 146 is directly connected to not only the drain electrode 142, but also the metal pattern 138 without contact holes. The data pad terminal 150 of an island shape is in contact with the data pad 136. Here, the gate pad 110 is still covered with the gate insulating layer 116.

Figure 7G:
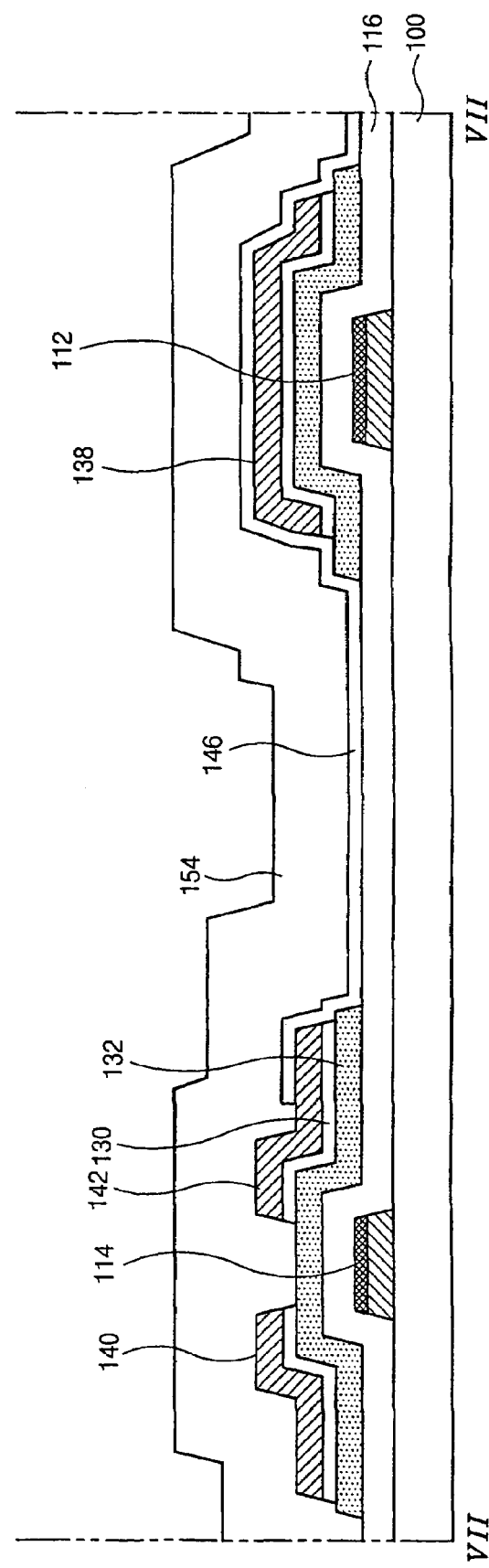
Figure 8G:
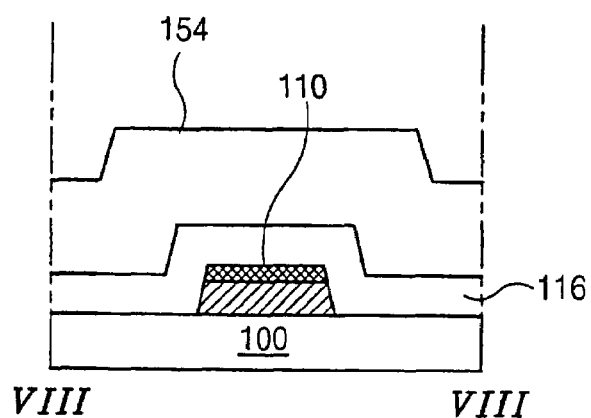
Figure 9G:
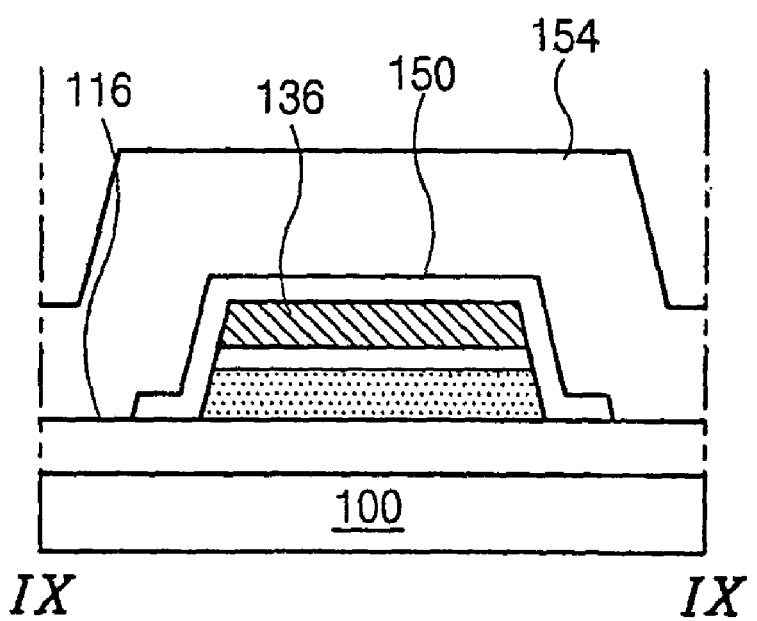

As illustrated in FIGS. 7G, 8G, and 9G, a passivation layer 154 is formed on the substrate 100 including the pixel electrode 146 and the data pad terminal 150. The passivation layer 154 may be formed by depositing an inorganic material, such as silicon nitride (SiNx) and silicon oxide ($SiO_2$), or by coating an organic material, such as benzocyclobutene and polyimide. Here, the gate pad 110 and the data pad terminal 150 are exposed so as to apply signals thereto.

Figure 7H:
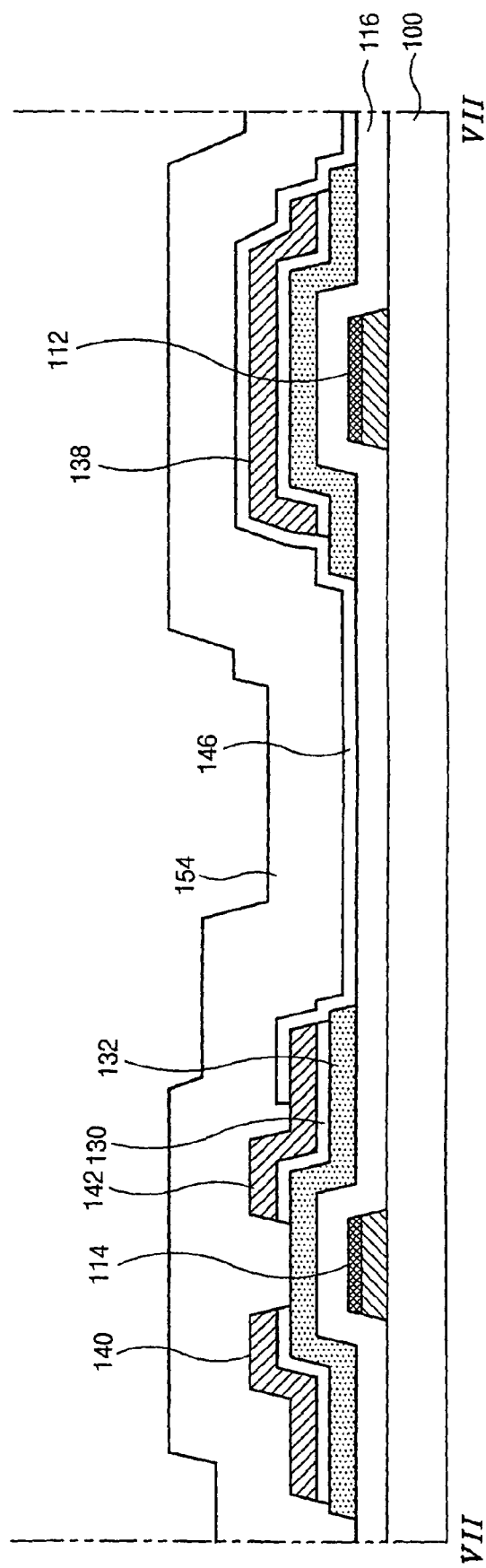
Figure 8H:
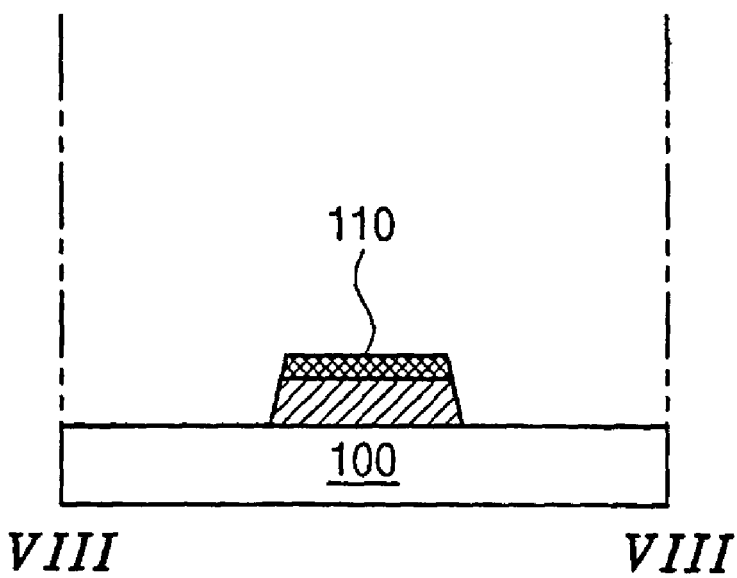
Figure 9H:
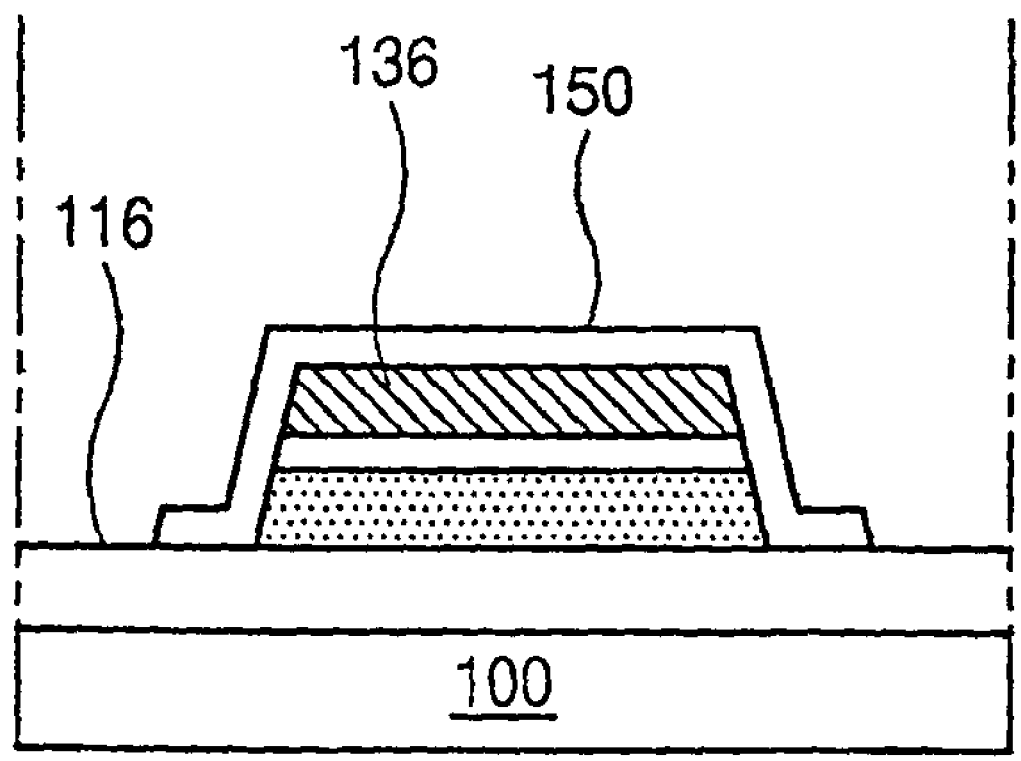

Thus, as illustrated in FIGS. 7H, 8H, and 9H, the gate insulating layer 116 and the passivation layer 154 on the gate pad 110 and the passivation layer 154 on the data pad terminal 150 are removed by a wet etching method, so that the gate pad 110 and the data pad terminal 150 are exposed. The wet etching method may include a dipping method to dip a subject matter in an etchant.

If the passivation layer 154 is formed of polyimide, the passivation layer 154 may be formed in regions except for the gate pad 110 and the data pad 136 by a printing method. Then, only the gate insulating layer on the gate pad 110 is removed by the dipping method. In addition, the passivation layer 154 may be used as an alignment layer by rubbing the surface thereof.

Meanwhile, the dipping method may be carried out after attaching the array substrate and a color filter substrate, thereby forming a liquid crystal panel.

Figure 10:
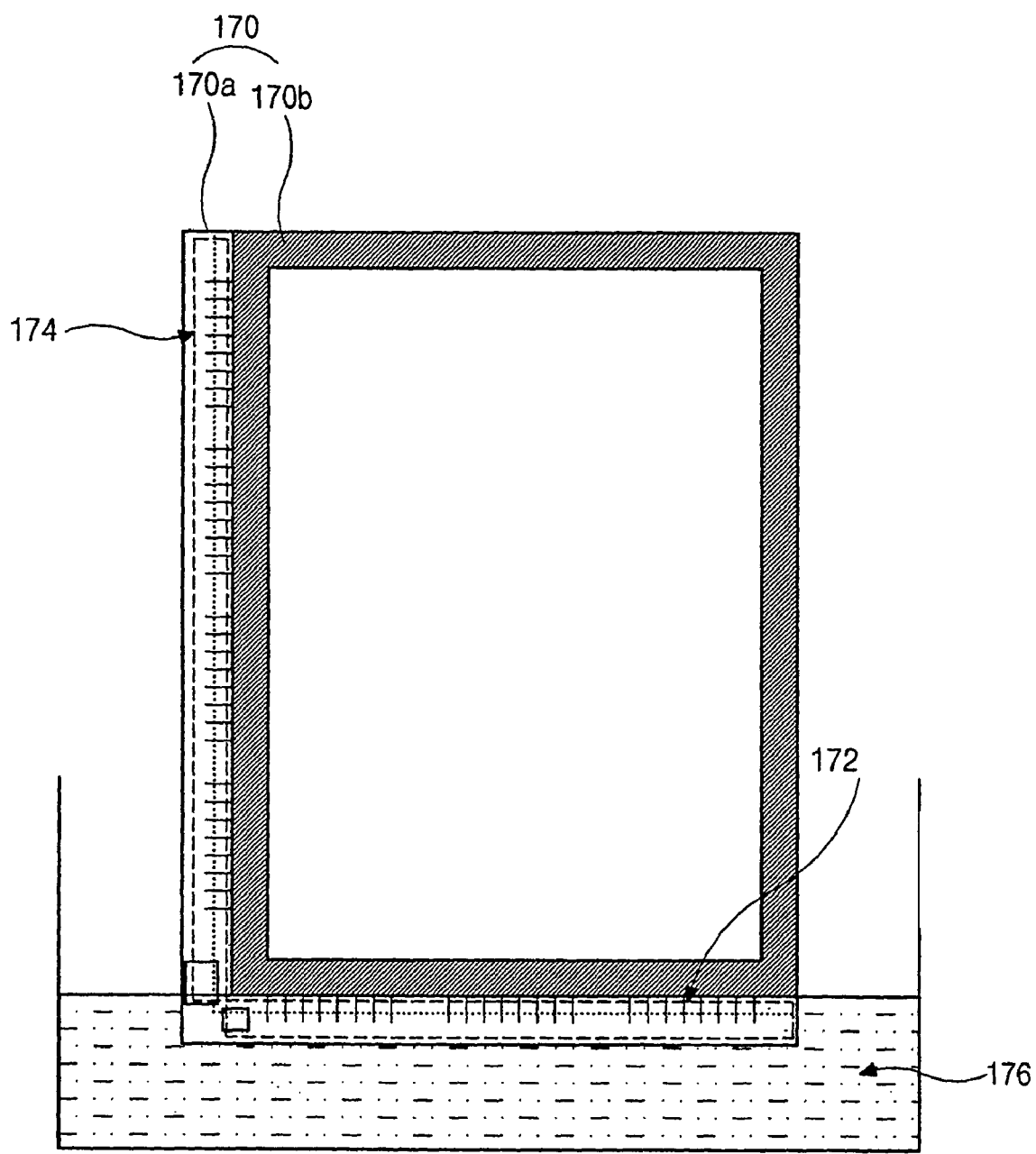
FIG. 10 is a schematic view showing a pad open process according to a first embodiment of the present invention.

FIG. 10 is a schematic view showing a pad open process according to a first embodiment of the present invention, wherein a dipping method is used.

First, an array substrate 170a, which is manufactured through the processes of FIGS. 7A to 7G, FIGS. 8A to 8G, and FIGS. 9A to 9G, and a color filter substrate 170b, which includes a common electrode (not shown), are attached to each other, so that the pixel electrode and the common electrode may face into each other, thereby forming a liquid crystal panel 170. The color filter substrate 170b is smaller than the array substrate 170a, and thus a gate pad portion 172, where gate pads 110 are formed, and a data pad portion 174, where data pads 136 and data pad terminals 150 are formed, are exposed by the color filter substrate 170b. Subsequently, liquid crystal material is inserted between the array substrate and the color filter substrate. Next, as shown in FIG. 10, the gate pad portion 172 of the liquid crystal panel 170 is dipped into an etchant 176, which may be referred to as a first etchant, and thus the gate pad 110 is exposed as shown in FIG. 8H. Additionally, the data pad portion 174 of the liquid crystal panel 170 is dipped into a second etchant, and thus the data pad terminal 150 is exposed as shown in FIG. 9H.

Here, it takes more time to expose the gate pad of the gate pad portion than the data pad portion due to the gate insulating layer. In addition, the first etchant and the second etchant may be the same or different depending on characteristics of the gate insulating layer and the passivation layer.

As stated above, if the passivation layer 154 is formed of polyimide, only the gate pad portion 172 of the liquid crystal panel 170 is dipped into an etchant. Therefore, as shown in FIGS. 8H and 9H, the gate pad 110, and the data pad terminal 150 are exposed.

Figure 11:
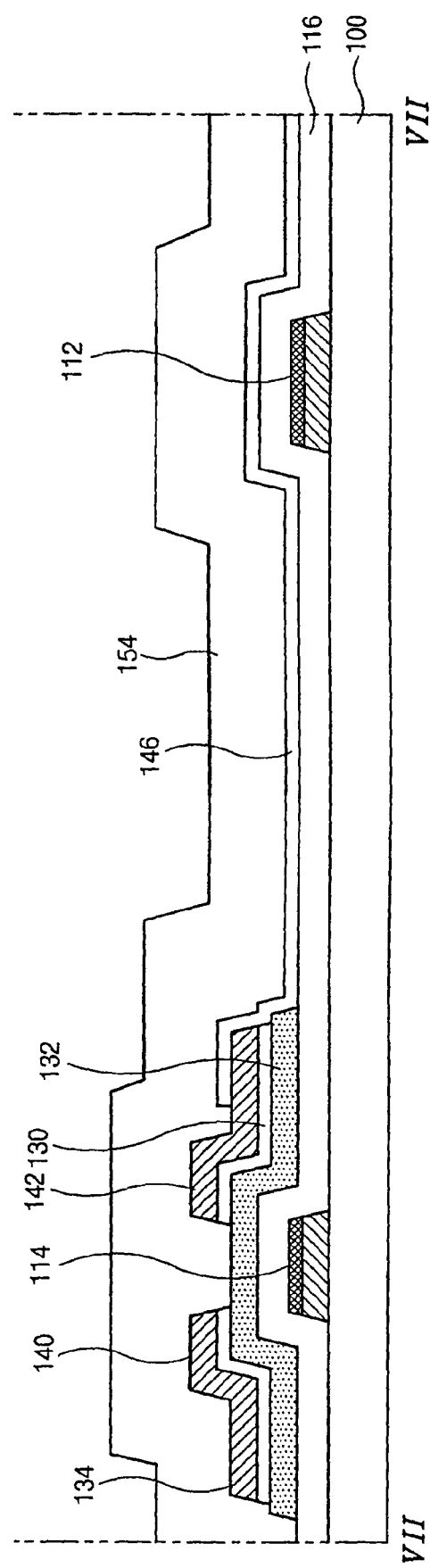
FIG. 11 is a cross-sectional view of another array substrate for a liquid crystal display device according to the present invention.

Meanwhile, in the array substrate of the present invention, the storage capacitor may be composed of the gate line and the pixel electrode. Another array substrate of such a structure is illustrated in FIG. 11. FIG. 11 has a similar structure as the array substrate of FIG. 7H except for the storage capacitor. The array substrate of FIG. 11 may be fabricated by not forming the metal pattern 138 and the second pattern 139 during the second mask process. The storage capacitor of FIG. 11 may have different capacitance from the storage capacitor of FIG. 7H.

The process of exposing pads or pad terminals of the pad portions may be accomplished by a polishing method.

Figure 12:
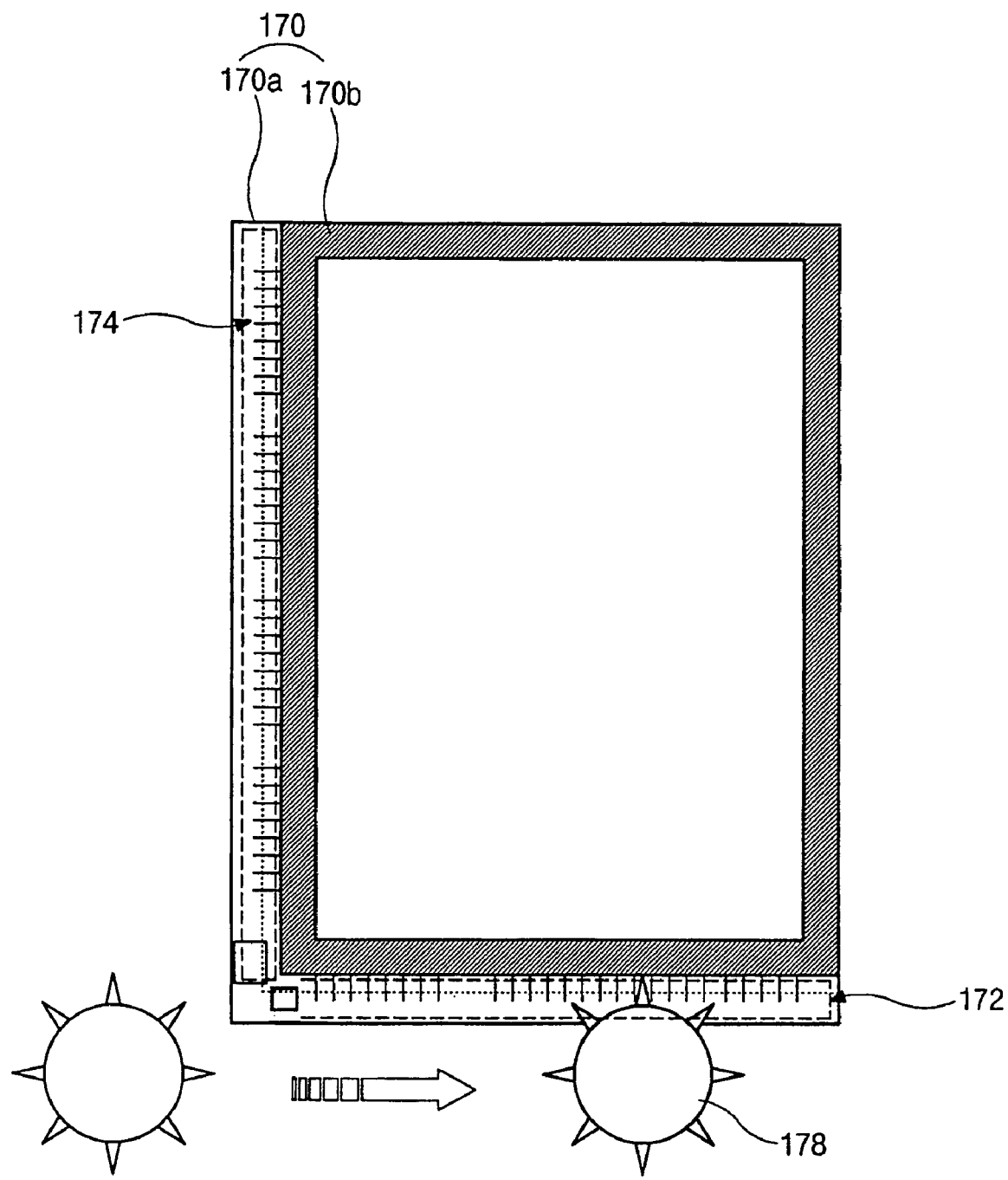
FIG. 12 is a schematic view showing a pad open process according to a second embodiment of the present invention.

FIG. 12 is a schematic view showing a pad open process according to a second embodiment of the present invention using a polishing method. A liquid crystal panel 170 is fabricated by attaching an array substrate 170a and a color filter substrate 170a, wherein the color filter substrate 170a is smaller than the array substrate 170a, thereby exposing a gate pad portion 172 and a data pad portion 174 of the array substrate 170a. The passivation layer 154 and the gate insulating layer 116 on the gate pad 110 of FIG. 8G and the passivation layer 154 on the data pad terminal 150 of FIG. 9G are removed by a polishing method, respectively, and as shown in FIGS. 8H and 9H, the gate pad 110 and the data pad terminal 150 are exposed.

Here, the polishing method may be a chemical mechanical polishing (CMP) method for planarizing the surface of a wafer or patterning materials that are difficult to be etched by a dry-etching method. The CMP method uses both a mechanical polishing effect by an abrasive and a chemical polishing effect by an acid solution or a basic solution.

As shown in FIG. 12, slurry (not shown) including an abrasive and an acid or basic solution is injected in a CMP apparatus 178, and the passivation layer 154 and the gate insulating layer 116 of FIG. 8G in the gate pad portion 172 are removed by polishing using the CMP apparatus, thereby exposing the gate pad 110 of FIG. 8H. The passivation layer 154 on the data pad terminal 150 is also removed by polishing using the CMP apparatus. Therefore, as shown in FIGS. 8H and 9H, the gate pad 110 and the data pad terminal 150 are exposed.

Here, it takes more time to expose the gate pad of the gate pad portion than the data pad portion due to the gate insulating layer. In addition, the slurries for the gate pad portion and the data pad portion may be the same or different depending on characteristics of the gate insulating layer and the passivation layer.

Alternatively, the process of exposing pads or pad terminals of the pad portions may be accomplished by a dry-etching method using plasma.

Figure 13:
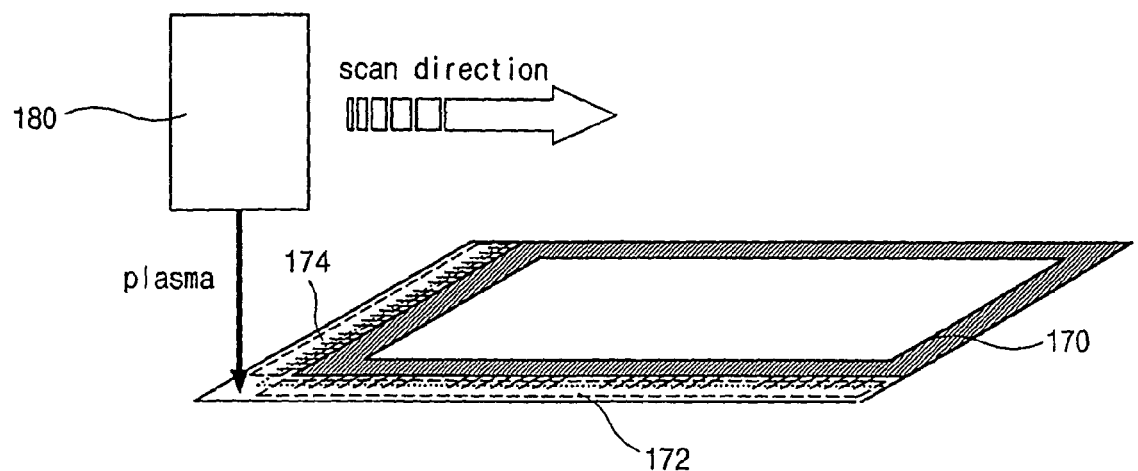
FIGS. 13 to 15 are schematic views showing a pad open process according to a third embodiment of the present invention.
Figure 14:
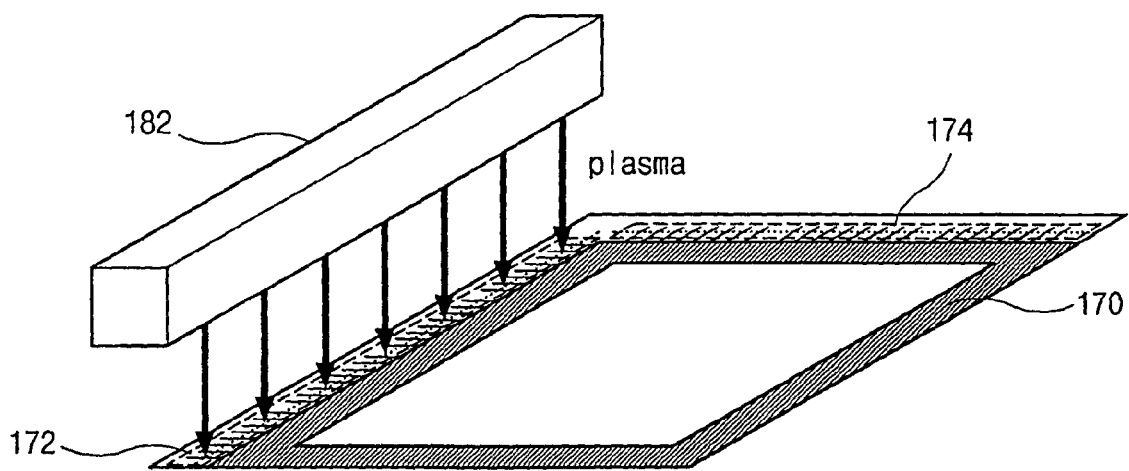
Figure 15:
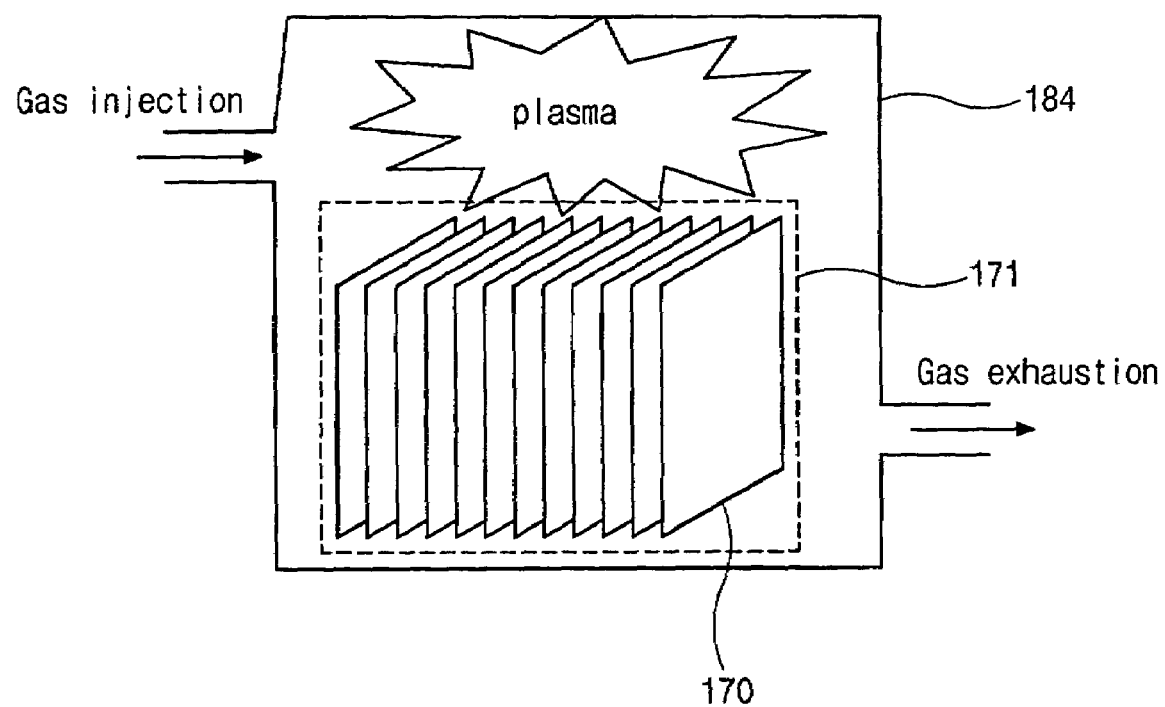

FIGS. 13 to 15 schematic views showing a pad open process according to a third embodiment of the present invention using a dry-etching method. The dry-etching method may use one of a beam type atmospheric pressure (AP) plasma shown in FIG. 13, a bar type AP plasma shown in FIG. 14, and a batch type low pressure (LP) plasma shown in FIG. 15.

As illustrated in FIG. 13, in the beam type AP plasma method, the gate pad portion 172 is selectively scanned by plasma emitted from a plasma gun 180. Thus, the passivation layer 154 and the gate insulating layer 116 of FIG. 8G in the gate pad portion 172 are removed, and the gate pad 110 of FIG. 8H is exposed. Also, the passivation layer 154 of FIG. 9G in the data pad portion 174 is removed, and the data pad terminal 150 of FIG. 9H is exposed.

In the bar type AP plasma method of FIG. 14, the gate pad portion 172 is selectively scanned by plasma emitted from a bar plasma gun 182, and the gate pad 110 of FIG. 8H is exposed. The bar plasma gun 182 may include the plasma guns of FIG. 13 connected in a row.

Meanwhile, as shown in FIG. 15, in the batch type LP plasma method, a batch 171 of liquid crystal panels 170, which are in a row and spaced apart from each other, are located in a plasma chamber 184, and are exposed to plasma under a low pressure. Therefore, the passivation layer 154 and the gate insulating layer 116 exposed by the color filter substrate (not shown), which are disposed on the gate pad 110 and the data pad terminal 150, are removed.

Here, it takes more time to expose the gate pad of the gate pad portion than the data pad portion due to the gate insulating layer. In addition, conditions of the processes for the gate pad portion and the data pad portion depend on characteristics of the gate insulating layer and the passivation layer. That is, if the gate insulating layer and the passivation layer may have different characteristics, the passivation layer in the gate pad portion and the data pad portion may be removed by a first plasma, and then the gate insulating layer may be etched by a second plasma.

In the present invention, since the array substrate is fabricated only through three mask processes, fabrication processes and costs are lowered, and productivity increases.

It will be apparent to those skilled in the art that various modifications and variations can be made in the method of fabricating the liquid crystal display device present invention without departing from the spirit or scope of the inventions. Thus, it is intended that the present invention covers the modifications and variations of this invention provided they come within the scope of the appended claims and their equivalents.

What is claimed is:

1. A method of fabricating a liquid crystal display device, comprising:
    forming a gate line, a gate pad, and a gate electrode on a first substrate;
    forming a gate insulating layer on the gate line, the gate electrode, and the gate pad;
    forming an active layer on the gate insulating layer;
    forming an ohmic contact layer on the active layer;
    forming a data line, a data pad, and source and drain electrodes on the ohmic contact layer;
    forming a pixel electrode contacting the drain electrode;
    forming a passivation layer on the substrate including the pixel electrode;
    forming a common electrode on a second substrate;
    attaching the first and second substrates such that the pixel electrode and the common electrode are facing into each other with a liquid crystal material interposed between the first and second substrates;
    applying a first etching process to portions of the passivation layer and the gate insulating layer to expose the gate pad by employing one of a beam type atmospheric pressure plasma and a batch type low pressure plasma process; and
    applying a second etching process to portions of the passivation layer to expose the data pad by employing one of the beam type atmospheric pressure plasma and a batch type low pressure plasma process.

2. The method according to claim 1, wherein the passivation layer is formed of an organic material.

3. The method according to claim 2, wherein the passivation layer is formed over an entire surface of the first substrate.

4. The method according to claim 2, wherein the passivation layer is formed by a printing method, and exposes portions corresponding to the gate pad and the data pad.

5. The method according to claim 4, wherein the passivation layer includes polyimide.

6. The method according to claim 5, further comprising rubbing the passivation layer.

7. The method according to claim 1, wherein the forming a pixel electrode includes forming a data pad terminal contacting the data pad.

8. The method according to claim 1, wherein the forming the active layer, forming the ohmic contact layer, and forming the data line, the data pad, and the source and drain electrodes are performed by a photolithography process.

9. The method according to claim 8, wherein the photolithography process is performed by using a mask having a transmitting portion, a blocking portion, and a half transmitting portion.

10. The method according to claim 9, wherein the half transmitting portion includes slits.

11. The method according to claim 9, wherein the photolithography process includes forming a photoresist pattern having a first thickness and a second thickness thinner than the first thickness.

12. The method according to claim 11, wherein the first thickness of the photoresist pattern corresponds to the blocking portion of the mask and the second thickness of the photoresist pattern corresponds to the half transmitting portion.

13. The method according to claim 11, wherein the photoresist pattern is a positive type such that a portion exposed to light is developed and removed.

14. The method according to claim 1, wherein the active layer has the same shape as the data line, the source electrode, the drain electrode, and the data pad, and has an additional portion between the source and drain electrodes.

15. The method according to claim 1, wherein the ohmic contact layer has the same shape as the data line, the source electrode, the drain electrode, and the data pad.

16. A method of fabricating an array substrate for a liquid crystal display device, comprising:
    forming a gate line, a gate pad, and a gate electrode on a first substrate:
    forming a gate insulating layer on the gate line, the gate electrode, and the gate pad;
    forming an active layer on the gate insulating layer;
    forming an ohmic contact layer on the active layer;
    forming a data line, a data pad, and source and drain electrodes on the ohmic contact layer;
    forming a pixel electrode contacting the drain electrode;
    forming a common electrode on a second substrate:
    attaching the first substrate and the second substrate with a liquid crystal material interposed between the first substrate and the second substrate;
    forming a passivation layer on the substrate including the pixel electrode;
    a first dipping process of dipping a gate pad portion of the attached first and second substrates into an etchant to expose the gate pad; and
    a second dipping process of dipping a data pad portion of the attached first and second substrates into an etchant to expose the data pad.

17. The method according to claim 16, wherein the passivation layer is formed by a printing method, and exposes portions corresponding to the gate pad and the data pad.

18. The method according to claim 17, wherein the passivation layer includes polyimide.

19. The method according to claim 18, further comprising rubbing the passivation layer.

20. The method according to claim 16, wherein the forming a pixel electrode includes forming a data pad terminal contacting the data pad.

21. The method according to claim 16, wherein the forming the active layer, forming the ohmic contact layer, and forming the data line, the data pad, and the source and drain electrodes are performed by a photolithography process.

22. The method according to claim 21, wherein the photolithography process is performed by using a mask having a transmitting portion, a blocking portion, and a half transmitting portion.

23. The method according to claim 22, wherein the half transmitting portion includes slits.

24. The method according to claim 22, wherein the photolithography process includes forming a photoresist pattern having a first thickness and a second thickness thinner than the first thickness.

25. The method according to claim 24, wherein the first thickness of the photoresist pattern corresponds to the blocking portion of the mask and the second thickness of the photoresist pattern corresponds to the half transmitting portion.

26. The method according to claim 24, wherein the photoresist pattern is a positive type such that a portion exposed to light is developed and removed.

27. The method according to claim 16, wherein the active layer has the same shape as the data line, the source electrode, the drain electrode, and the data pad, and has an additional portion between the source and drain electrodes.

28. The method according to claim 16, wherein the ohmic contact layer has the same shape as the data line, the source electrode, the drain electrode, and the data pad.

29. A method of fabricating a liquid crystal display device, comprising:

forming a gate line, a gate pad, and a gate electrode on a first substrate;

forming a gate insulating layer on the gate line, the gate electrode, and the gate pad;

forming an active layer on the gate insulating layer;

forming an ohmic contact layer on the active layer;

forming a data line, a data pad, and source and drain electrodes on the ohmic contact layer;

forming a pixel electrode contacting the drain electrode;

forming a passivation layer on the substrate including the pixel electrode;

forming a common electrode on a second substrate;

attaching the first and second substrates such that the pixel electrode and the common electrode are facing into each other with a liquid crystal material interposed between the first and second substrates;

performing a first chemical mechanical polishing of portions of the passivation layer and the gate insulating layer to expose the gate pad; and performing a second chemical mechanical polishing of portions of the passivation layer to expose the data pad.

30. The method according to claim 29, wherein the first mechanical polishing includes a dry etching process using atmospheric pressure plasma.

31. The method according to claim 30, wherein the dry etching is performed by using one of an atmospheric pressure plasma beam and an atmospheric pressure plasma bar.

* * * * *